US007388453B2

(12) United States Patent
Okuyama et al.

(10) Patent No.: US 7,388,453 B2
(45) Date of Patent: Jun. 17, 2008

(54) HIGH FREQUENCY MODULE

(75) Inventors: Yuichiro Okuyama, Tokyo (JP); Hideya Matsubara, Tokyo (JP); Masami Itakura, Tokyo (JP); Masashi Iwata, Tokyo (JP)

(73) Assignee: TDK Corporation, Tokyo (JP)

( * ) Notice: Subject to any disclaimer, the term of this patent is extended or adjusted under 35 U.S.C. 154(b) by 291 days.

(21) Appl. No.: 11/267,340

(22) Filed: Nov. 7, 2005

(65) Prior Publication Data

US 2006/0103485 A1 May 18, 2006

(30) Foreign Application Priority Data

Nov. 15, 2004 (JP) ............................. 2004-329997

(51) Int. Cl.
*H03H 7/46* (2006.01)
*H01P 5/12* (2006.01)

(52) U.S. Cl. ....................... 333/132; 333/126; 333/129

(58) Field of Classification Search ................ 333/126, 333/129, 132
See application file for complete search history.

(56) References Cited

U.S. PATENT DOCUMENTS

| | | | |
|---|---|---|---|
| 5,768,691 | A | 6/1998 | Matero et al. |
| 5,926,075 | A | 7/1999 | Hayashi |
| 6,115,585 | A | 9/2000 | Matero et al. |
| 6,366,564 | B1 | 4/2002 | Hiraka et al. |
| 6,411,178 | B1 | 6/2002 | Matsumura et al. |
| 6,496,083 | B1 | 12/2002 | Kush et al. |
| 6,759,925 | B2 | 7/2004 | Satoh et al. |
| 7,242,268 | B2 | 7/2007 | Hagiwara et al. |
| 2002/0137471 | A1 | 9/2002 | Satoh et al. |
| 2003/0183928 | A1 | 10/2003 | Miyazawa |
| 2004/0266378 | A1 | 12/2004 | Fukamachi et al. |

FOREIGN PATENT DOCUMENTS

| | | |
|---|---|---|
| EP | 0 823 751 A2 | 2/1998 |
| EP | 1 152 543 A1 | 11/2001 |
| JP | A 09-36604 | 2/1997 |
| JP | A-9-260901 A | 10/1997 |
| JP | A 09-261110 | 10/1997 |
| JP | A-11-031905 | 2/1999 |
| JP | A-11-055002 | 2/1999 |
| JP | A 11-055156 | 2/1999 |
| JP | A 2000-349581 | 12/2000 |
| JP | A 2001-119209 | 4/2001 |
| JP | A 2001-136045 | 5/2001 |
| JP | A 2001-185902 | 7/2001 |
| JP | A-2001-285114 | 10/2001 |
| JP | A 2001-285122 | 10/2001 |
| JP | A-2002-118487 | 4/2002 |
| JP | A 2003-037520 | 2/2003 |
| JP | A 2003-152588 | 5/2003 |
| JP | A 2003-298305 | 10/2003 |
| JP | A-2004-166258 | 6/2004 |

*Primary Examiner*—Benny Lee
*Assistant Examiner*—Kimberly E Glenn
(74) *Attorney, Agent, or Firm*—Oliff & Berridge, PLC

(57) ABSTRACT

A high frequency module comprises a switch circuit connected to two antenna terminals and two diplexers connected to the switch circuit. Each of the diplexers incorporates two band-pass filters (BPFs). Each of the diplexers further incorporates a capacitor provided between one of the BPFs and a node of signal paths and another capacitor provided between the other of the BPFs and the node.

15 Claims, 18 Drawing Sheets

HIGH FREQUENCY MODULE

BACKGROUND OF THE INVENTION

1. Field of the Invention

The present invention relates to a high frequency module used in a communications apparatus for a wireless local area network (LAN), for example.

2. Description of the Related Art

Attention has been recently drawn to a wireless LAN that forms a LAN through the use of radio waves as a technique for constructing a network easily. A plurality of standards are provided for the wireless LAN, such as the IEEE 802.11b that uses a 2.4 GHz band as a frequency band and the IEEE 802.11a and the IEEE 802.11g that use a 5 GHz band as a frequency band. It is therefore required that communications apparatuses used for the wireless LAN conform to a plurality of standards.

Furthermore, the communications status on the wireless LAN varies depending on the location of the communications apparatus and the environment. It is therefore desirable to adopt a diversity for choosing one of a plurality of antennas whose communications status is best.

In the communications apparatus for the wireless LAN, a circuit portion (hereinafter called a high frequency circuit section) that is connected to antennas and processes high frequency signals is incorporated in a card-shaped adapter, for example. In addition, it is expected that the communications apparatus for the wireless LAN is installed in a mobile communications device such as a cellular phone. A reduction in size of the high frequency circuit section is therefore desired.

A type of mobile communications device such as a cellular phone is known, wherein a high frequency circuit section is formed as a module operable in a plurality of frequency bands. For example, Japanese Published Patent Application (hereinafter referred to as 'JP-A') 2003-152588 discloses a module incorporating two diplexers and a single switch circuit. In this module, the switch circuit switches one of the two diplexers to be connected to the single antenna. Each of the diplexers separates two signals in different frequency bands from each other.

JP-A 2000-349581 discloses a typical diplexer comprising a combination of a low-pass filter and a high-pass filter.

JP-A 11-55156 discloses a switch circuit incorporating a GaAs field-effect transistor. In this switch circuit, a transmission section and a reception section are connected to terminals through which transmission signals and reception signals pass, respectively, through capacitors for blocking direct currents.

Each of JP-A 2001-136045 and JP-A 2001-119209 discloses a module incorporating a duplexer for separating transmission signals from reception signals. This module incorporates two band-pass filters each of which is made up of inductor conductors and capacitor conductors of a layered structure made up of a plurality of insulating layers, a plurality of inductor conductors and a plurality of capacitor conductors. Furthermore, these two publications disclose a technique in which the axis of the inductor conductors making up one of the band-pass filters is made orthogonal to the axis of the inductor conductors making up the other of the band-pass filters. In addition, the two publications disclose a diplexer as another example of the module to which the above-mentioned technique is applied. These publications disclose that the diplexer is formed by combining a low-pass filter and a high-pass filter, for example.

As previously described, it is desirable that a communications apparatus for the wireless LAN conform to a plurality of standards whose operable frequency bands are different. It is therefore desired that the high frequency circuit section of the communications apparatus for the wireless LAN be capable of processing transmission signals and reception signals in a plurality of frequency bands. To achieve this, a configuration is conceivable in which the high frequency circuit section comprises a plurality of diplexers for separating signals in two different frequency bands from each other, and a switch circuit for connecting one of the diplexers to an antenna terminal. In this case, a direct-current control signal for controlling switching of the state is applied to the switch circuit. It is necessary to prevent a direct current resulting from the control signal from flowing into the diplexers. To do so, a technique is conceivable in which circuits for processing transmission signals and reception signals respectively are connected through capacitors for blocking direct currents to terminals through which transmission signals and reception signals pass respectively, as disclosed in JP-A 11-55156.

Consideration will now be given to a configuration in which a diplexer as the circuits for processing transmission signals and reception signals is connected through a capacitor for blocking direct currents to the terminals through which transmission signals and reception signals pass respectively. This configuration has a problem that will now be described. A diplexer is a device for separating signals in two different frequency bands from each other as previously mentioned. If a capacitor for blocking direct currents is provided between the switch circuit and the diplexer, the capacitor has an influence on passing characteristics along two signal paths corresponding to the two frequency bands in the diplexer. The problem is that it is difficult to predetermine the capacitance of the capacitor for blocking direct currents so that the passing characteristics along the two signal paths are both favorable. That is, if the capacitance of the capacitor is predetermined so that the passing characteristic along one of the paths is favorable, the passing characteristic along the other of the paths deteriorates. If the capacitance of the capacitor is predetermined so that the passing characteristics along the two paths are balanced, the passing characteristics both deteriorate to some extent.

OBJECT AND SUMMARY OF THE INVENTION

It is an object of the invention to provide a high frequency module that is capable of processing transmission signals and reception signals in a plurality of frequency bands and that can be designed so that a favorable passing characteristic is obtained for each signal path.

A high frequency module of the invention comprises: an antenna terminal connected to an antenna; a plurality of diplexers each of which separates signals in a first frequency band from signals in a second frequency band higher than the first frequency band; a switch circuit for connecting one of the diplexers to the antenna terminal; and a substrate for integrating the foregoing components.

In the high frequency module of the invention, the switch circuit receives a control signal for controlling switching of a state. Each of the diplexers incorporates: first to third ports; a first filter that is provided between the first and second ports and that allows signals in the first frequency band to pass; and a second filter that is provided between the first and third ports and that allows signals in the second frequency band to pass, the first port being connected to the switch circuit. Each of the diplexers further incorporates: a node between a signal path to the first filter and a signal path to the second filter that are seen from the first port; a first capacitor that is provided between the node and the first filter and that blocks passage of direct currents resulting from the control signal; and a second capacitor that is provided between the node and the second filter and that blocks passage of direct currents resulting from the control signal.

In the high frequency module of the invention, the state of the switch circuit is switched in response to the control signal, and the switch circuit connects one of the diplexers to the antenna terminal. Each of the diplexers separates signals in the first frequency band from signals in the second frequency band. In each of the diplexers the first and second capacitors block passage of direct currents resulting from the control signal.

In one of the diplexers of the high frequency module of the invention, the first port may receive reception signals in the first and second frequency bands inputted to the antenna terminal and passing through the switch circuit, the first filter may allow the reception signal in the first frequency band to pass, the second port may output the reception signal in the first frequency band, the second filter may allow the reception signal in the second frequency band to pass, and the third port may output the reception signal in the second frequency band.

In addition, in another one of the diplexers of the high frequency module of the invention, the second port may receive a transmission signal in the first frequency band, the first filter may allow the transmission signal in the first frequency band to pass, the third port may receive a transmission signal in the second frequency band, the second filter may allow the transmission signal in the second frequency band to pass, and the first port may output the transmission signals in the first and second frequency bands.

The high frequency module of the invention may comprise a first antenna terminal and a second antenna terminal as the antenna terminal. In this case, the switch circuit connects one of the diplexers to one of the first and second antenna terminals.

In the high frequency module of the invention, the first capacitor may have a capacitance greater than that of the second capacitor. In this case, the capacitance of the first capacitor may fall within a range of 10 to 100 pF inclusive. Furthermore, the substrate may be a layered substrate including dielectric layers and conductor layers alternately stacked. In this case, the first capacitor may be mounted on the layered substrate, and the second capacitor may be formed by using at least one of the dielectric layers and at least one of the conductor layers.

In the high frequency module of the invention, the switch circuit may be mounted on the substrate. The switch circuit may be formed by using a field-effect transistor made of a GaAs compound semiconductor.

In the high frequency module of the invention, the substrate may be a multilayer substrate of low-temperature co-fired ceramic. In this case, the switch circuit may be formed by using a field-effect transistor made of a GaAs compound semiconductor and may be mounted on the substrate. The substrate may incorporate a plurality of inductance elements and a plurality of capacitance elements for forming each of the diplexers. The high frequency module may further comprise: a plurality of signal terminals for connecting the diplexers to external circuits; and a ground terminal connected to a ground, wherein the antenna terminal, the signal terminals and the ground terminal are formed on a periphery of the substrate.

In the high frequency module of the invention, each of the filters may be a band-pass filter. The band-pass filters may be formed by using resonant circuits. The substrate may be a layered substrate including dielectric layers and conductor layers alternately stacked, and the resonant circuits may be formed by using some of the dielectric layers and some of the conductor layers. Each of the resonant circuits may include a distributed constant line formed by using one of the conductor layers.

Each of the resonant circuits may include a transmission line that is formed by using one of the conductor layers and that has an inductance. In addition, in each of the diplexers, the longitudinal direction of the transmission line that the resonant circuit of the first filter includes and the longitudinal direction of the transmission line that the resonant circuit of the second filter includes may intersect at a right angle.

In the high frequency module of the invention, if each of the filters is a band-pass filter, each of the diplexers may further incorporate a low-pass filter that is connected in series to the second filter and that allows signals in the second frequency band to pass.

According to the high frequency module of the invention, each of the diplexers incorporates: the first capacitor provided between the first filter and the node between the signal path to the first filter and the signal path to the second filter that are seen from the first port; and the second capacitor provided between the second filter and the node. According to the invention, it is possible to predetermine the capacitances of the first and second capacitors so that favorable passing characteristics are obtained for the signal path to the first filter and the signal path to the second filter, respectively. As a result, according to the invention, it is possible to implement the high frequency module that is capable of processing transmission signals and reception signals in a plurality of frequency bands and that can be designed so that a favorable passing characteristic is obtained for each signal path.

The high frequency module of the invention may comprise the first antenna terminal and the second antenna terminal as the antenna terminal, and the switch circuit may connect one of the diplexers to one of the first and second antenna terminals. In this case, the high frequency module provided for a diversity is achieved.

In the high frequency module of the invention, each of the filters may be a band-pass filter. In this case, it is possible to reduce the number of filters provided in a circuit connected to the high frequency module and to relieve the conditions imposed on the filters provided in the circuit connected to the high frequency module.

In the high frequency module of the invention, the band-pass filters may be formed by using resonant circuits. In this case, the number of elements making up the band-pass filters are reduced and it is therefore easy to adjust the characteristics of the band-pass filters.

The substrate may be a layered substrate including dielectric layers and conductor layers alternately stacked, and the resonant circuits may be formed by using some of the dielectric layers and some of the conductor layers. In this case, it is possible to further reduce the high frequency module in size.

In the high frequency module of the invention, each of the resonant circuits may include a distributed constant line formed by using one of the conductor layers. In this case, it is possible to further reduce the high frequency module in size and to achieve desired characteristics of the band-pass filters more easily, compared with a case in which each of the band-pass filters is made up of a lumped constant element only, when great attenuation is required in a frequency region outside the pass band of the band-pass filters and such a characteristic is required that the insertion loss abruptly changes near the boundary between the pass band and the frequency region outside the pass band.

In the high frequency module of the invention, each of the resonant circuits may include a transmission line that is formed by using one of the conductor layers and that has an inductance, and, in each of the diplexers, the longitudinal direction of the transmission line that the resonant circuit of the first filter includes and the longitudinal direction of the transmission line that the resonant circuit of the second filter includes may intersect at a right angle. In this case, it is possible to prevent electromagnetic interference between the first and second filters.

In the high frequency module of the invention, if each of the filters is a band-pass filter, each of the diplexers may further incorporate a low-pass filter that is connected to the second filter in series and that allows signals in the second frequency band to pass. In this case, it is possible to increase the insertion loss in a band higher than the second frequency band while suppressing an increase in the insertion loss in the second frequency band along the path of signals in the second frequency band.

Other and further objects, features and advantages of the invention will appear more fully from the following description.

DETAILED DESCRIPTION OF THE PREFERRED EMBODIMENT

A high frequency module of an embodiment of the invention will now be described with reference to the accompanying drawings. The high frequency module of the embodiment is used in a communications apparatus for a wireless LAN and designed to process reception signals and transmission signals in a first frequency band and reception signals and transmission signals in a second frequency band that is higher than the first frequency band. The first frequency band is a 2.4 GHz band that is used for the IEEE 802.11b, for example. The second frequency band is a 5 GHz band that is used for the IEEE 802.11a or the IEEE 802.11g, for example. The high frequency module of the embodiment is provided for a diversity.

Figure 1:
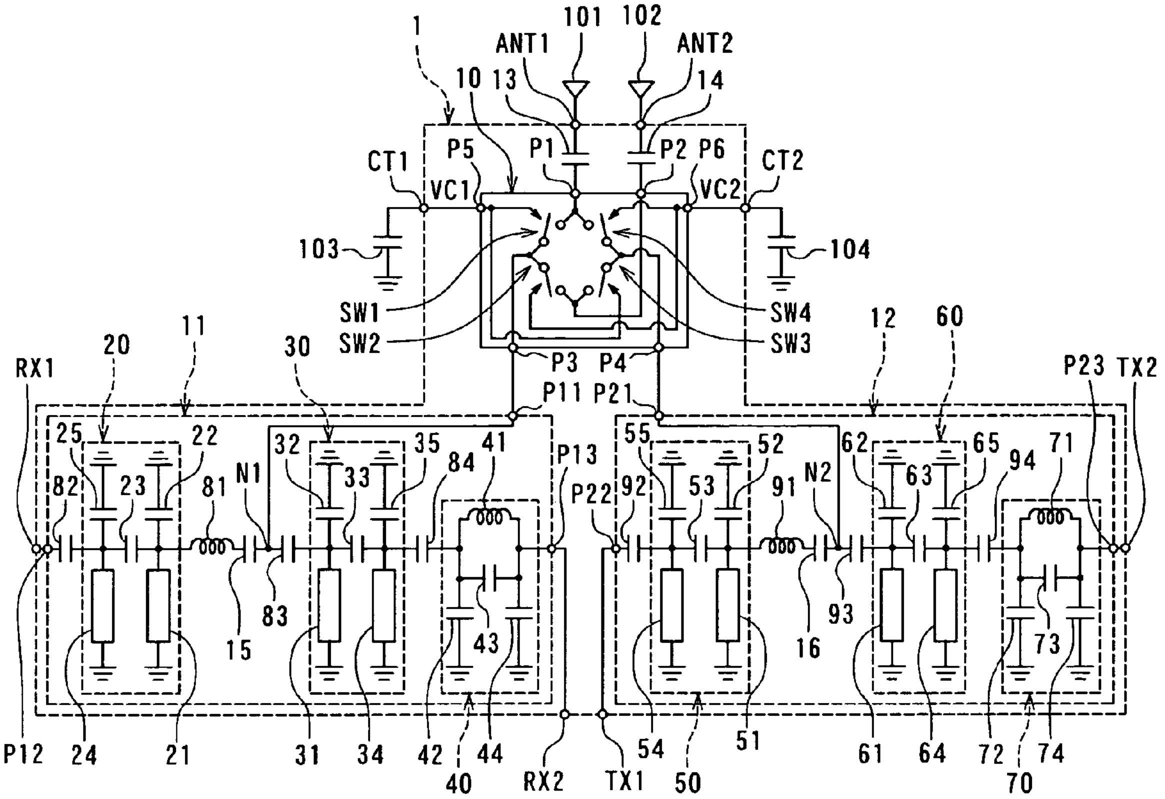
FIG. 1 is a schematic diagram illustrating a high frequency module of an embodiment of the invention.

FIG. 1 is a schematic diagram illustrating the high frequency module of the embodiment. The high frequency module 1 comprises: two antenna terminals ANT1 and ANT2 connected to different antennas 101 and 102, respectively; a first reception signal terminal RX1 for outputting a reception signal (hereinafter called a first reception signal) in the first frequency band; a second reception signal terminal RX2 for outputting a reception signal (hereinafter called a second reception signal) in the second frequency band; a first transmission signal terminal TX1 for receiving a transmission signal (hereinafter called a first transmission signal) in the first frequency band; a second transmission signal terminal TX2 for receiving a transmission signal (hereinafter called a second transmission signal) in the second frequency band; and control terminals CT1 and CT2 for receiving control signals VC1 and VC2, respectively. The control terminals CT1 and CT2 are grounded through capacitors 103 and 104, respectively, that are provided outside the high frequency module 1. The reception signal terminals RX1 and RX2, the transmission signal terminals TX1 and TX2, and the control terminals CT1 and CT2 are connected to external circuits.

The high frequency module 1 further comprises: a switch circuit 10 connected to the antenna terminals ANT1 and ANT2; a first diplexer 11 connected to the reception signal terminals RX1 and RX2 and the switch circuit 10; and a second diplexer 12 connected to the transmission signal terminals TX1 and TX2 and the switch circuit 10.

The high frequency module 1 further comprises capacitors 13 and 14. The capacitor 13 is inserted in series to a signal path between the switch circuit 10 and the antenna terminal ANT1. The capacitor 14 is inserted in series to a signal path between the switch circuit 10 and the antenna terminal ANT2. Each of the capacitors 13 and 14 is provided for blocking passing of a direct current resulting from the control signals VC1 and VC2.

The switch circuit 10 incorporates six ports P1 to P6. The port P1 is connected to the antenna terminal ANT1 through the capacitor 13. The port P2 is connected to the antenna terminal ANT2 through the capacitor 14. The port P3 is connected to the diplexer 11. The port P4 is connected to the diplexer 12. The ports P5 and P6 are connected to the control terminals CT1 and CT2, respectively.

The switch circuit 10 further incorporates four switches SW1 to SW4 for each of which a conducting state or a nonconducting state is chosen. Each of the switches SW1 to SW4 is formed by using a field-effect transistor made of a GaAs compound semiconductor, for example. The switch SW1 has an end connected to the port P1 and the other end connected to the port P3. The switch SW2 has an end connected to the port P2 and the other end connected to the port P3. The switch SW3 has an end connected to the port P2 and the other end connected to the port P4. The switch SW4 has an end connected to the port P1 and the other end connected to the port P4.

The switches SW1 and SW3 are conducting when the control signal VC1 inputted to the port P5 is high. The switches SW1 and SW3 are nonconducting when the control signal VC1 is low. The switches SW2 and SW4 are conducting when the control signal VC2 inputted to the port P6 is high. The switches SW2 and SW4 are nonconducting when the control signal VC2 is low. Consequently, when the control signal VC1 is high and the control signal VC2 is low, the ports P1 and P3 are connected to each other while the ports P2 and P4 are connected to each other. At this time, the diplexer 11 is connected to the antenna terminal ANT1 while the diplexer 12 is connected to the antenna terminal ANT2. On the other hand, when the control signal VC1 is low and the control signal VC2 is high, the ports P1 and P4 are connected to each other while the ports P2 and P3 are connected to each other. At this time, the diplexer 11 is connected to the antenna terminal ANT2 while the diplexer 12 is connected to the antenna terminal ANT1. In such a manner, the switch circuit 10 connects one of the diplexers 11 and 12 to one of the antenna terminals ANT1 and ANT2.

The diplexer 11 has three ports P11 to P13. The port P11 is connected to the port P3 of the switch circuit 10. The port P12 is connected to the reception signal terminal RX1. The port P13 is connected to the reception signal terminal RX2.

The diplexer 11 further incorporates: two bands-pass filters (hereinafter referred to as BPFs) 20 and 30; a low-pass filter (which may be hereinafter referred to as an LPF) 40; an inductor 81; and capacitors 15, 82, 83 and 84. The capacitor 15 has an end connected to the port P11. The inductor 81 has an end connected to the other end of the capacitor 15. The BPF 20 has an end connected to the other end of the inductor 81 and has the other end connected to the port P12 through the capacitor 82. The BPF 30 has an end connected to the port P11 through the capacitor 83 and has the other end connected to an end of the LPF 40 through the capacitor 84. The other end of the LPF 40 is connected to the port P13. The BPF 20 corresponds to the first filter of the invention. The BPF 30 corresponds to the second filter of the invention. The capacitor 15 corresponds to the first capacitor of the invention. The capacitor 83 corresponds to the second capacitor of the invention. The capacitor 15 has a capacitance greater than that of the capacitor 83. The capacitance of the capacitor 15 falls within a range of 10 to 100 pF inclusive, for example. The capacitance of the capacitor 83 falls within a range of 0.5 to 1.5 pF inclusive, for example.

The BPF 20 incorporates: transmission lines 21 and 24 having an inductance; and capacitors 22, 23 and 25. Each of the transmission line 21 and the capacitors 22 and 23 has an end connected to the port P11 through the inductor 81. Each of the transmission line 21 and the capacitor 22 has the other end grounded. Each of the transmission line 24 and the capacitor 25 has an end connected to the other end of the capacitor 23 and connected to the port P12 through the capacitor 82. Each of the transmission line 24 and the capacitor 25 has the other end grounded. The transmission line 21 and the capacitor 22 make up a parallel resonant circuit. The transmission line 24 and the capacitor 25 make up another parallel resonant circuit. The BPF 20 is thus formed by using the two parallel resonant circuits.

The BPF 30 incorporates: transmission lines 31 and 34 having an inductance; and capacitors 32, 33 and 35. Each of the transmission line 31 and the capacitors 32 and 33 has an end connected to the port P11 through the capacitor 83. Each of the transmission line 31 and the capacitor 32 has the other end grounded. Each of the transmission line 34 and the capacitor 35 has an end connected to the other end of the capacitor 33 and connected to the LPF 40 through the capacitor 84. Each of the transmission line 34 and the capacitor 35 has the other end grounded. The transmission line 31 and the capacitor 32 make up a parallel resonant circuit. The transmission line 34 and the capacitor 35 make up another parallel resonant circuit. The BPF 30 is thus formed by using the two parallel resonant circuits.

The LPF 40 incorporates an inductor 41 and capacitors 42, 43 and 44. Each of the inductor 41 and the capacitors 42 and 43 has an end connected to the BPF 30 through the capacitor 84. Each of the inductor 41 and the capacitor 43 has the other end connected to the port P13. The capacitor 42 has the other end grounded. The capacitor 44 has an end connected to the port P13 and the other end grounded.

The BPF 20 allows signals of frequencies within the first frequency band to pass and intercepts signals of frequencies outside the first frequency band. As a result, the BPF 20 allows passage of the first reception signal that has been inputted to one of the antenna terminals ANT1 and ANT2 and passed through the switch circuit 10, and sends it to the reception signal terminal RX1. The capacitor 15 blocks passage of direct currents resulting from the control signals VC1 and VC2. The inductor 81 and the capacitor 82 improve a passing characteristic of the path of the first reception signal including the BPF 20.

The BPF 30 allows signals of frequencies within the second frequency band to pass and intercepts signals of frequencies outside the second frequency band. The LPF 40 allows signals of frequencies within the second frequency band and signals of frequencies lower than the second frequency band to pass, and intercepts signals of frequencies higher than the second frequency band. As a result, the BPF 30 and the LPF 40 allow passage of the second reception signal that has been inputted to the antenna terminal ANT1 or ANT2 and passed through the switch circuit 10, and send it to the reception signal terminal RX2. The capacitor 83 blocks passage of direct currents resulting from the control signals VC1 and VC2. The capacitors 83 and 84 improve a passing characteristic of the path of the second reception signal including the BPF 30 and the LPF 40.

Here, the node between the signal path to the BPF 20 and the signal path to the BPF 30 each of which is seen from the port P11 is indicated with N1. In the embodiment, the capacitors 15 and 83 for blocking passage of direct currents resulting from the control signals VC1 and VC2 are provided between the node N1 and the BPF 20 and between the node N1 and the BPF 30, respectively. No capacitor for blocking passage of direct currents resulting from the control signals VC1 and VC2 is provided between the port P11 and the node N1.

The diplexer 12 has three ports P21 to P23. The port P21 is connected to the port P4 of the switch circuit 10. The port P22 is connected to the transmission signal terminal TX1. The port P23 is connected to the transmission signal terminal TX2.

The diplexer 12 further incorporates two BPFs 50 and 60, an LPF 70, an inductor 91, and capacitors 16, 92, 93 and 94. The capacitor 16 has an end connected to the port P21. The inductor 91 has an end connected to the other end of the capacitor 16. The BPF 50 has an end connected to the other end of the inductor 91 and has the other end connected to the port P22 through the capacitor 92. The BPF 60 has an end connected to the port P21 through the capacitor 93, and the other end connected to an end of the LPF 70 through the capacitor 94. The other end of the LPF 70 is connected to the port P23. The BPF 50 corresponds to the first filter of the invention. The BPF 60 corresponds to the second filter of the invention. The capacitor 16 corresponds to the first capacitor of the invention. The capacitor 93 corresponds to the second capacitor of the invention. The capacitor 16 has a capacitance greater than that of the capacitor 93. The capacitance of the capacitor 16 falls within a range of 10 to 100 pF inclusive, for example. The capacitance of the capacitor 93 falls within a range of 0.5 to 1.5 pF inclusive, for example.

The BPF 50 incorporates: transmission lines 51 and 54 having an inductance; and capacitors 52, 53 and 55. Each of the transmission line 51 and the capacitors 52 and 53 has an end connected to the port P21 through the inductor 91. Each of the transmission line 51 and the capacitor 52 has the other end grounded. Each of the transmission line 54 and the capacitor 55 has an end connected to the other end of the capacitor 53 and connected to the port P22 through the capacitor 92. Each of the transmission line 54 and the capacitor 55 has the other end grounded. The transmission line 51 and the capacitor 52 make up a parallel resonant circuit. The transmission line 54 and the capacitor 55 make up another parallel resonant circuit. The BPF 50 is thus formed by using the two parallel resonant circuits.

The BPF 60 incorporates: transmission lines 61 and 64 having an inductance; and capacitors 62, 63 and 65. Each of the transmission line 61 and the capacitors 62 and 63 has an end connected to the port P21 through the capacitor 93. Each of the transmission line 61 and the capacitor 62 has the other end grounded. Each of the transmission line 64 and the capacitor 65 has an end connected to the other end of the capacitor 63 and connected to the LPF 70 through the capacitor 94. Each of the transmission line 64 and the capacitor 65 has the other end grounded. The transmission line 61 and the capacitor 62 make up a parallel resonant circuit. The transmission line 64 and the capacitor 65 make up another parallel resonant circuit. The BPF 60 is thus formed by using the two parallel resonant circuits.

The LPF 70 incorporates an inductor 71, and capacitors 72, 73 and 74. Each of the inductor 71 and the capacitors 72 and 73 has an end connected to the BPF 60 through the capacitor 94. Each of the inductor 71 and the capacitor 73 has the other end connected to the port P23. The capacitor 72 has the other end grounded. The capacitor 74 has an end connected to the port P23 and the other end grounded.

The BPF 50 allows signals of frequencies within the first frequency band to pass and intercepts signals of frequencies outside the first frequency band. As a result, the BPF 50 allows the first transmission signal inputted to the transmission signal terminal TX1 to pass and sends it to the switch circuit 10. The capacitor 16 blocks passage of direct currents resulting from the control signals VC1 and VC2. The inductor 91 and the capacitor 92 improve a passing characteristic of the path of the first transmission signal including the BPF 50.

The BPF 60 allows signals of frequencies within the second frequency band to pass and intercepts signals of frequencies outside the second frequency band. The LPF 70 allows signals of frequencies within the second frequency band and signals of frequencies lower than the second frequency band to pass, and intercepts signals of frequencies higher than the second frequency band. As a result, the BPF 60 and the LPF 70 allow the second transmission signal inputted to the transmission signal terminal TX2 to pass and sends it to the switch circuit 10. The capacitor 93 blocks passage of direct currents resulting from the control signals VC1 and VC2. The capacitors 93 and 94 improve a passing characteristic of the path of the second transmission signal including the BPF 60 and the LPF 70.

Here, the node between the signal path to the BPF 50 and the signal path to the BPF 60 each of which is seen from the port P21 is indicated with N2. In the embodiment, the capacitors 16 and 93 for blocking passage of direct currents resulting from the control signals VC1 and VC2 are provided between the node N2 and the BPF 50 and between the node N2 and the BPF 60, respectively. No capacitor for blocking passage of direct currents resulting from the control signals VC1 and VC2 is provided between the port P21 and the node N2.

In the high frequency module 1, the first reception signal inputted to the antenna terminal ANT1 or ANT2 passes through the switch circuit 10 and the BPF 20 and is sent to the reception signal terminal RX1. The second reception signal inputted to the antenna terminal ANT1 or ANT2 passes through the switch circuit 10, the BPF 30 and the LPF 40, and is sent to the reception signal terminal RX2. The first transmission signal inputted to the transmission signal terminal TX1 passes through the BPF 50 and the switch circuit 10 and is sent to the antenna terminal ANT1 or ANT2. The second transmission signal inputted to the transmission signal terminal TX2 passes through the LPF 70, the BPF 60 and the switch circuit 10 and is sent to the antenna terminal ANT1 or ANT2.

Figure 2:
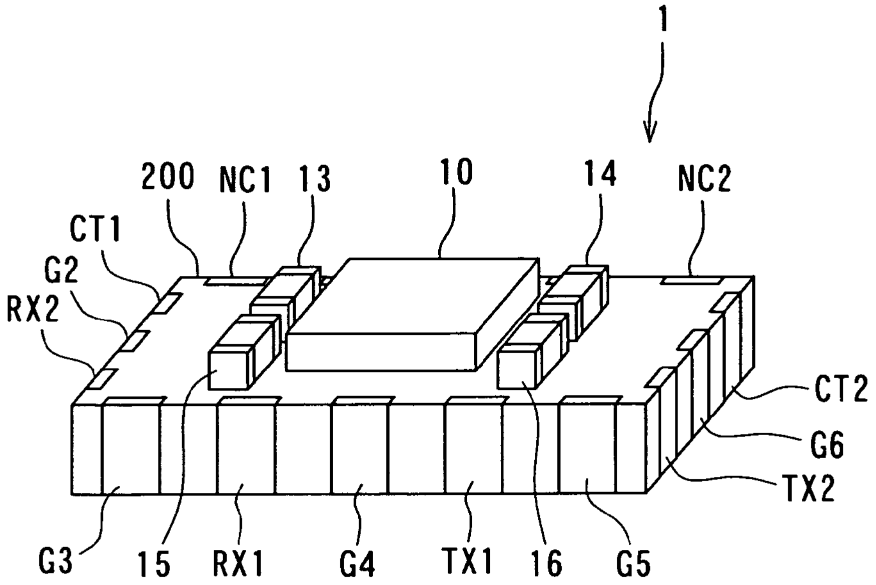
FIG. 2 is a perspective view of an appearance of the high frequency module of the embodiment of the invention.
Figure 3:
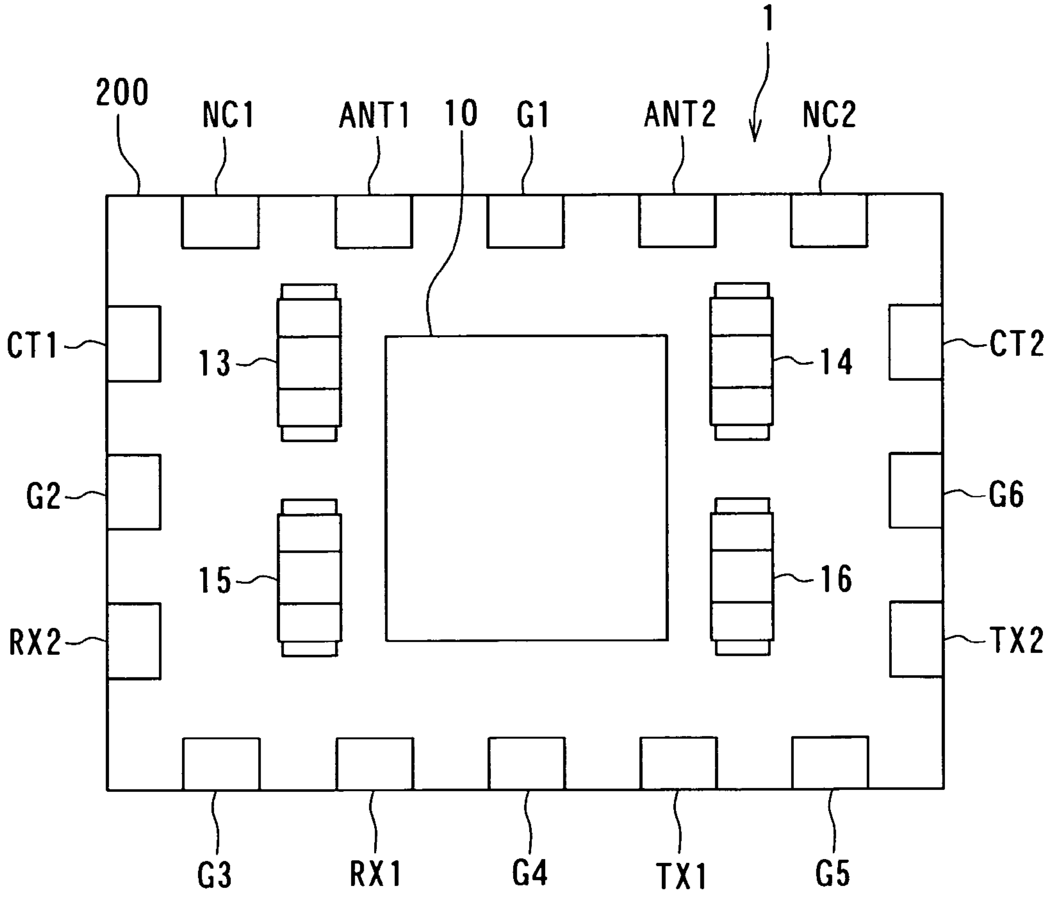
FIG. 3 is a top view of the high frequency module of the embodiment of the invention.

Reference is now made to FIG. 2 and FIG. 3 to describe the structure of the high frequency module 1. FIG. 2 is a perspective view illustrating an appearance of the high frequency module 1. FIG. 3 is a top view of the high frequency module 1. As shown in FIG. 2 and FIG. 3, the high frequency module 1 comprises a layered substrate 200 for integrating the above-mentioned components of the high frequency module 1. The layered substrate 200 incorporates dielectric layers and conductor layers that are alternately stacked. The circuits of the high frequency module 1 are formed by using the conductor layers located inside the layered substrate 200 or on the surfaces of the layered substrate 200, and elements mounted on the top surface of the layered substrate 200. Here is an example in which the switch circuit 10 and the capacitors 13 to 16 of FIG. 1 are mounted on the layered substrate 200. The switch circuit 10 has the form of a single component. The layered substrate 200 is a multilayer substrate of low-temperature co-fired ceramic, for example.

On the top, bottom and side surfaces of the layered substrate 200, the above-mentioned terminals ANT1, ANT2, RX1, RX2, TX1, TX2, CT1 and CT2, six ground terminals G1 to G6, and terminals NC1 and NC2 are provided. The ground terminals G1 to G6 are connected to the ground. The terminals NC1 and NC2 are neither connected to the conductor layers inside the layered substrate 200 nor external circuits.

Figure 4:
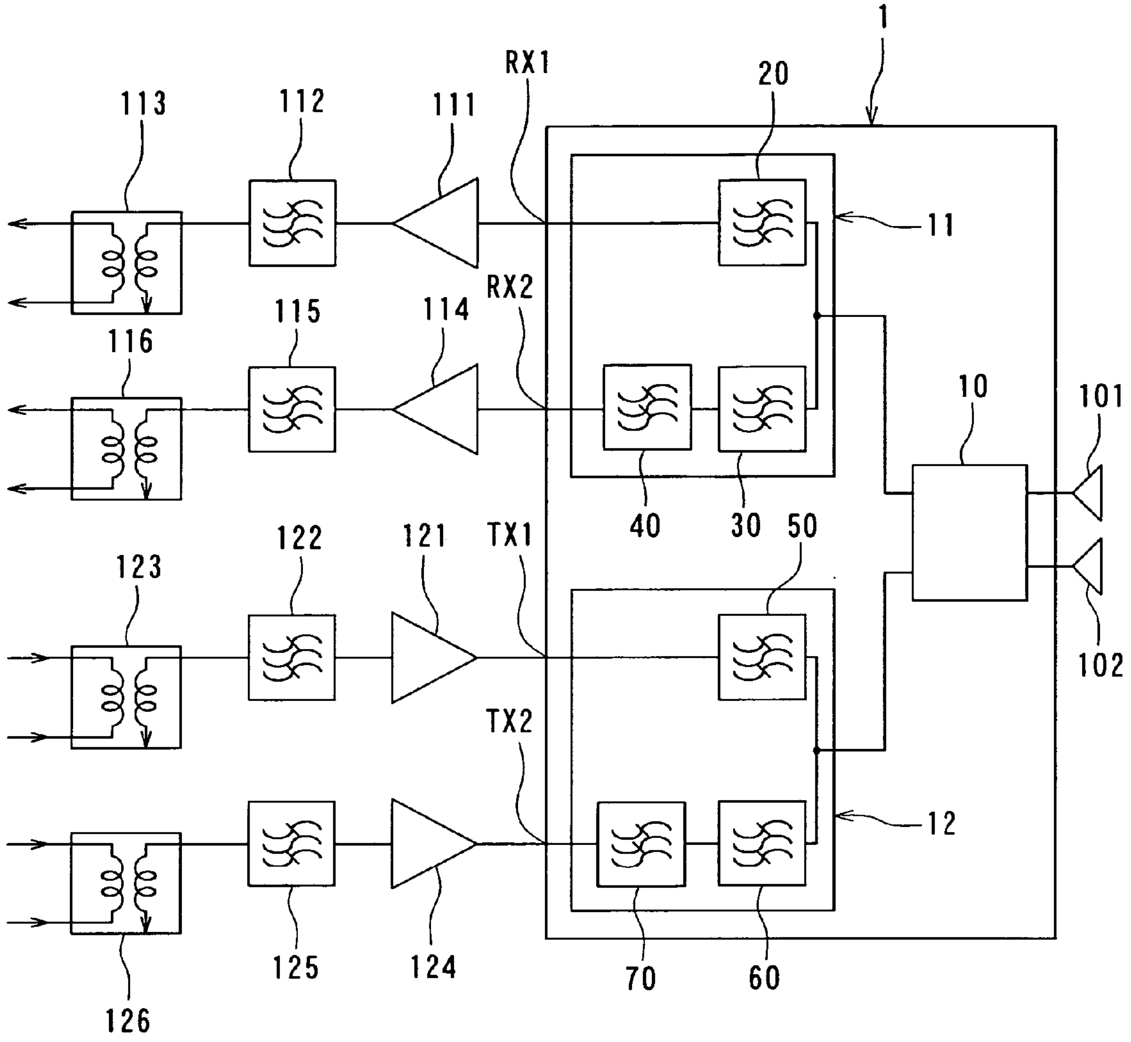
FIG. 4 is a block diagram illustrating an example of the configuration of a high frequency circuit section of a communications apparatus for a wireless LAN in which the high frequency module of the embodiment of the invention is used.

Reference is now made to FIG. 4 to describe an example of configuration of a high frequency circuit section of a communications apparatus for a wireless LAN in which the high frequency module 1 of the embodiment is used. The high frequency circuit section of FIG. 4 comprises the high frequency module 1, and two antennas 101 and 102 connected to the high frequency module 1.

The high frequency circuit section further comprises: a low-noise amplifier 111 having an input connected to the reception signal terminal RX1 of the high frequency module 1; a BPF 112 having an end connected to an output of the low-noise amplifier 111; and a balun 113 having an unbalanced terminal connected to the other end of the BPF 112. The first reception signal outputted from the reception signal terminal RX1 is amplified at the low-noise amplifier 111, then passes through the BPF 112, is converted to a balanced signal at the balun 113, and is outputted from two balanced terminals of the balun 113.

The high frequency circuit section further comprises: a low-noise amplifier 114 having an input connected to the reception signal terminal RX2 of the high frequency module 1; a BPF 115 having an end connected to an output of the low-noise amplifier 114; and a balun 116 having an unbalanced terminal connected to the other end of the BPF 115. The second reception signal outputted from the reception signal terminal RX2 is amplified at the low-noise amplifier 114, then passes through the BPF 115, is converted to a balanced signal at the balun 116, and is outputted from two balanced terminals of the balun 116.

The high frequency circuit section further comprises: a power amplifier 121 having an output connected to the transmission signal terminal TX1 of the high frequency module 1; a BPF 122 having an end connected to an input of the power amplifier 121; and a balun 123 having an unbalanced terminal connected to the other end of the BPF 122. A balanced signal corresponding to the first transmission signal is inputted to two balanced terminals of the balun 123, is converted to an unbalanced signal at the balun 123, passes through the BPF 122, is amplified at the power amplifier 121, and then given to the transmission signal terminal TX1 as the first transmission signal.

The high frequency circuit section further comprises: a power amplifier 124 having an output connected to the transmission signal terminal TX2 of the high frequency module 1; a BPF 125 having an end connected to an input of the power amplifier 124; and a balun 126 having an unbalanced terminal connected to the other end of the BPF 125. A balanced signal corresponding to the second transmission signal is inputted to two balanced terminals of the balun 126, is converted to an unbalanced signal at the balun 126, passes through the BPF 125, is amplified at the power amplifier 124, and then given to the transmission signal terminal TX2 as the second transmission signal.

The configuration of the high frequency circuit section is not limited to the one illustrated in FIG. 4 but a variety of modifications are possible. For example, the high frequency circuit section may be one that does not incorporate the baluns 113 and 116 and that allows a signal having passed through the BPFs 112 and 115 to be outputted as an unbalanced signal as it is. The positional relationship between the low-noise amplifier 111 and the BPF 112 and the positional relationship between the low-noise amplifier 114 and the BPF 115 may be the reverse of the ones shown in FIG. 4. Furthermore, low-pass filters or high-pass filters may be provided in place of the BPFs 112, 115, 122 and 125.

Reference is now made to FIG. 5 to FIG. 24 to describe an example of configuration of the layered substrate 200. FIG. 5 to FIG. 23 illustrate top surfaces of first to nineteenth (the lowest) dielectric layers from the top. FIG. 24 illustrates the nineteenth dielectric layer from the top and a conductor layer therebelow. Dots of FIG. 5 to FIG. 23 indicate through holes.

Figure 5:
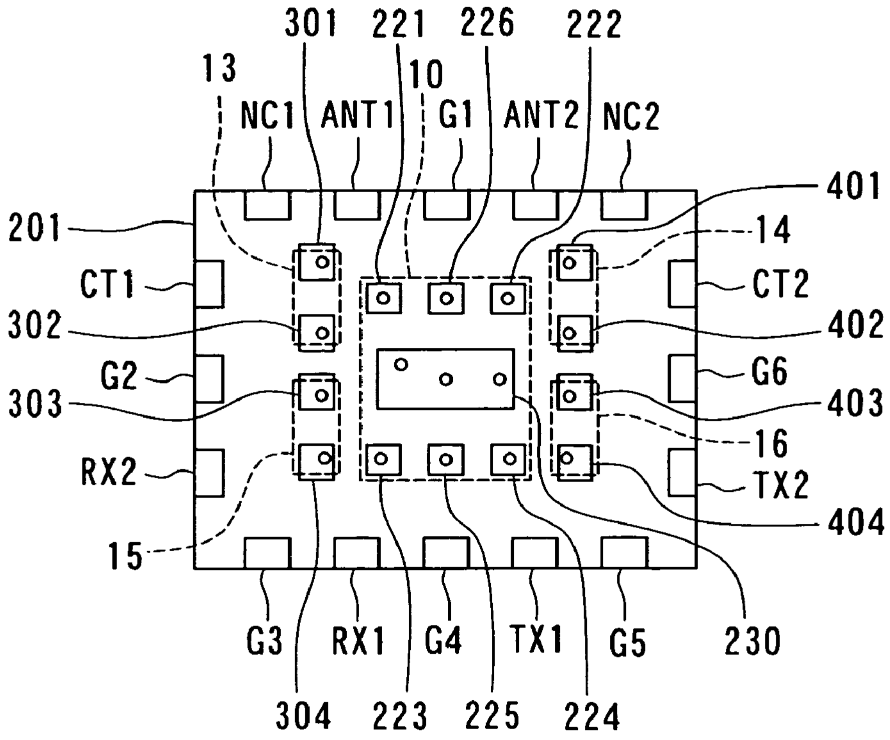
FIG. 5 is a top view illustrating a top surface of a first dielectric layer of the layered substrate of FIG. 3.

On the top surface of the first dielectric layer 201 of FIG. 5, conductor layers which make up the terminals ANT1, ANT2, RX1, RX2, TX1, TX2, CT1, CT2, G1 to G6, NC1, and NC2 are formed. Furthermore, on the top surface of the dielectric layer 201, conductor layers 301 and 302 to which the capacitor 13 is connected, conductor layers 401 and 402 to which the capacitor 14 is connected, conductor layers 303 and 304 to which the capacitor 15 is connected, and conductor layers 403 and 404 to which the capacitor 16 is connected are formed. Furthermore, on the top surface of the dielectric layer 201, six conductor layers 221 to 226 to which the ports P1 to P6 of the switch circuit 10 are connected and a conductor layer 230 connected to the ground are formed.

Figure 6:
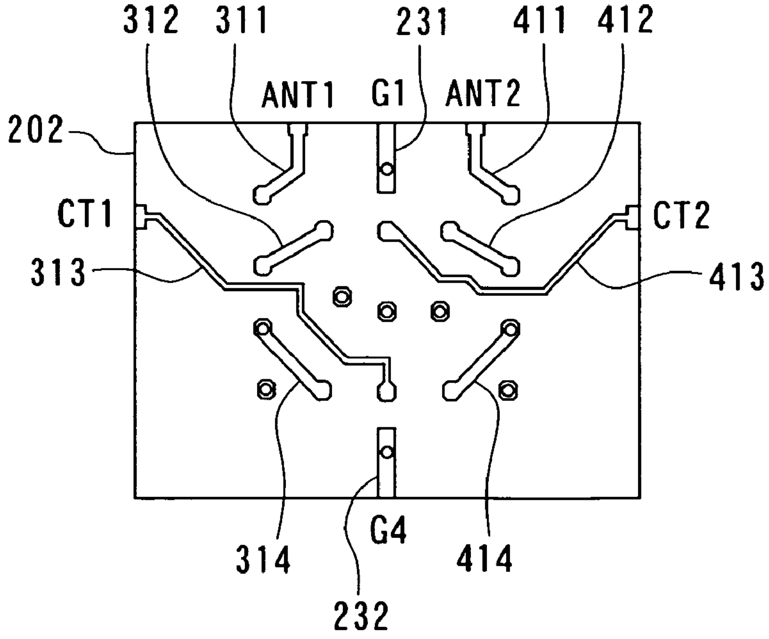
FIG. 6 is a top view illustrating a top surface of a second dielectric layer of the layered substrate of FIG. 3.

On the top surface of the second dielectric layer 202 of FIG. 6, conductor layers 231, 232, 311 to 314, and 411 to 414 are formed. The conductor layer 231 is connected to the terminal G1. The conductor layer 232 is connected to the terminal G4.

The conductor layer 311 is connected to the terminal ANT1. The conductor layer 301 of FIG. 5 is connected to the conductor layer 311 via a through hole formed in the dielectric layer 201. The conductor layers 221 and 302 of FIG. 5 are connected to the conductor layer 312 via two through holes formed in the dielectric layer 201. The conductor layer 313 is connected to the terminal CT1. The conductor layer 225 of FIG. 5 is connected to the conductor layer 313 via a through hole formed in the dielectric layer 201. The conductor layers 223 and 303 of FIG. 5 are connected to the conductor layer 314 via two through holes formed in the dielectric layer 201.

The conductor layer 411 is connected to the terminal ANT2. The conductor layer 401 of FIG. 5 is connected to the conductor layer 411 via a through hole formed in the dielectric layer 201. The conductor layers 222 and 402 of FIG. 5 are connected to the conductor layer 412 via two through holes formed in the dielectric layer 201. The conductor layer 413 is connected to the terminal CT2. The conductor layer 226 of FIG. 5 is connected to the conductor layer 413 via a through hole formed in the dielectric layer 201. The conductor layers 224 and 403 of FIG. 5 are connected to the conductor layer 414 via two through holes formed in the dielectric layer 201.

Figure 7:
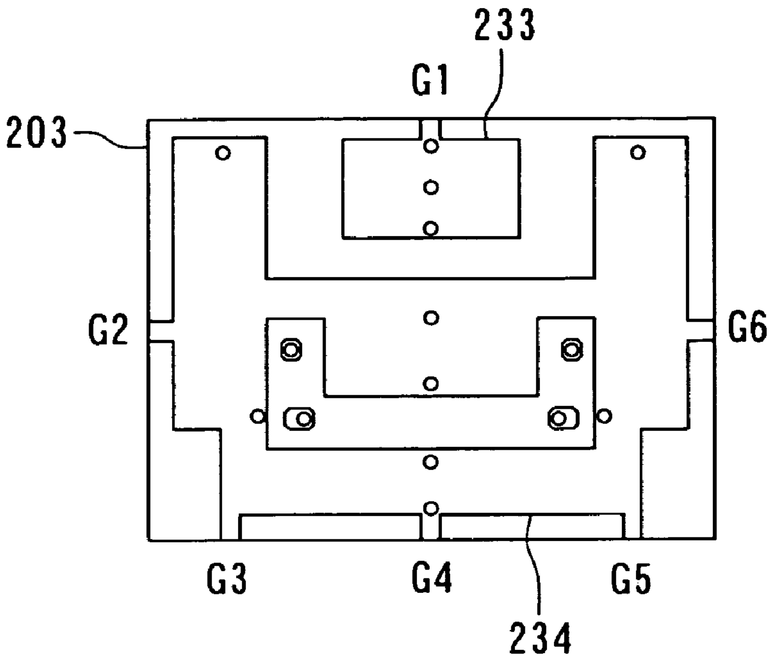
FIG. 7 is a top view illustrating a top surface of a third dielectric layer of the layered substrate of FIG. 3.

On the top surface of the third dielectric layer 203 of FIG. 7, conductor layers 233 and 234 for the ground are formed. The conductor layer 233 is connected to the terminal G1. The conductor layer 231 of FIG. 6 is connected to the conductor layer 233 via a through hole formed in the dielectric layer 202. The conductor layer 234 is connected to the terminals G2 to G6. The conductor layer 232 of FIG. 6 is connected to the conductor layer 234 via a through hole formed in the dielectric layer 202. The conductor layer 230 of FIG. 5 is connected to the conductor layer 234 via through holes formed in the dielectric layers 201 and 202.

Figure 8:
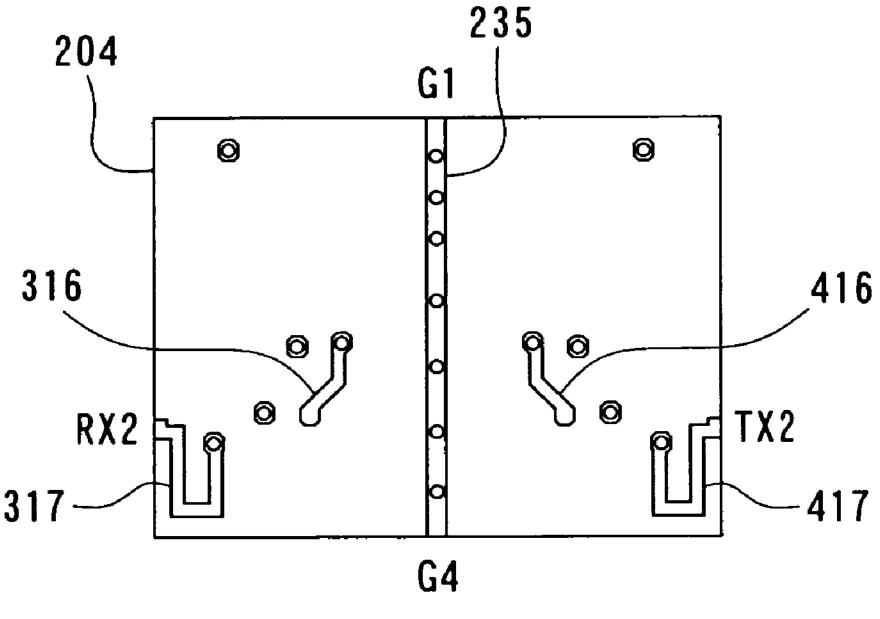
FIG. 8 is a top view illustrating a top surface of a fourth dielectric layer of the layered substrate of FIG. 3.

On the top surface of the fourth dielectric layer 204 of FIG. 8, a conductor layer 235 for the ground, conductor layers 316 and 416, and conductor layers 317 and 417 for inductors are formed. The conductor layer 235 is connected to the terminals G1 and G4. The conductor layers 233 and 234 of FIG. 7 are connected to the conductor layer 235 via a plurality of through holes formed in the dielectric layer 203.

The conductor layer 304 of FIG. 5 is connected to the conductor layer 316 via through holes formed in the dielectric layers 201 to 203. The conductor layer 317 has an end connected to the terminal RX2. The conductor layer 317 makes up the inductor 41 of FIG. 1.

The conductor layer 404 of FIG. 5 is connected to the conductor layer 416 via through holes formed in the dielectric layers 201 to 203. The conductor layer 417 has an end connected to the terminal TX2. The conductor layer 417 makes up the inductor 71 of FIG. 1.

Figure 9:
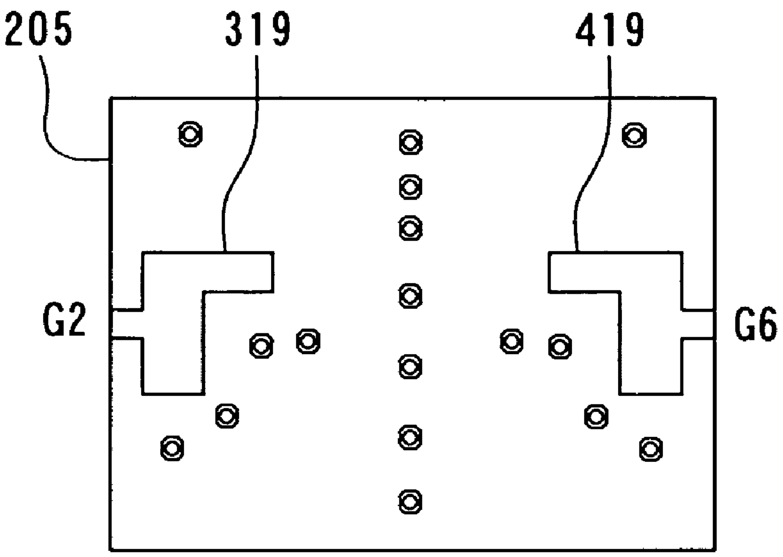
FIG. 9 is a top view illustrating a top surface of a fifth dielectric layer of the layered substrate of FIG. 3.

On the top surface of the fifth dielectric layer 205 of FIG. 9, conductor layers 319 and 419 for capacitors are formed. The conductor layer 319 is connected to the terminal G2. The conductor layer 319 makes up a portion of each of the capacitors 32, 35 and 42 of FIG. 1. The conductor layer 419 is connected to the terminal G6. The conductor layer 419 makes up a portion of each of the capacitors 62, 65 and 72 of FIG. 1.

Figure 10:
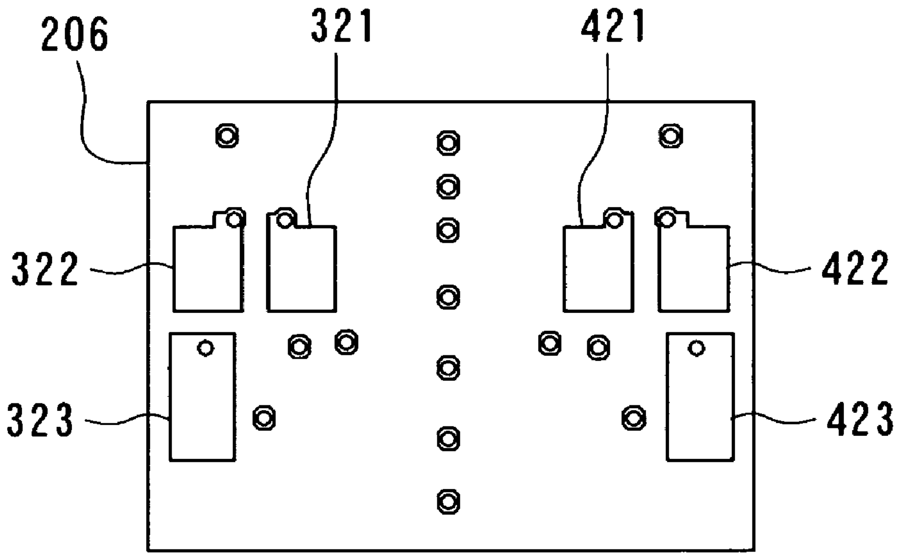
FIG. 10 is a top view illustrating a top surface of a sixth dielectric layer of the layered substrate of FIG. 3.

On the top surface of the sixth dielectric layer 206 of FIG. 10, conductor layers 321, 322, 323, 421, 422 and 423 for capacitors are formed.

The conductor layer 321 makes up the capacitor 32 of FIG. 1, together with the conductor layer 319 of FIG. 9. The conductor layer 322, together with the conductor layer 319 of FIG. 9, makes up the capacitor 35 of FIG. 1. The conductor layer 323, together with the conductor layer 319 of FIG. 9, makes up the capacitor 42 of FIG. 1 and a portion of the capacitor 43 of FIG. 1. The conductor layer 317 of FIG. 8 is connected to the conductor layer 323 via through holes formed in the dielectric layers 204 and 205.

The conductor layer 421, together with the conductor layer 419 of FIG. 9, makes up the capacitor 62 of FIG. 1. The conductor layer 422, together with the conductor layer 419 of FIG. 9, makes up the capacitor 65 of FIG. 1. The conductor layer 423, together with the conductor layer 419 of FIG. 9, makes up the capacitor 72 of FIG. 1 and a portion of the capacitor 73 of FIG. 1. The conductor layer 417 of FIG. 8 is connected to the conductor layer 423 via through holes formed in the dielectric layers 204 and 205.

Figure 11:
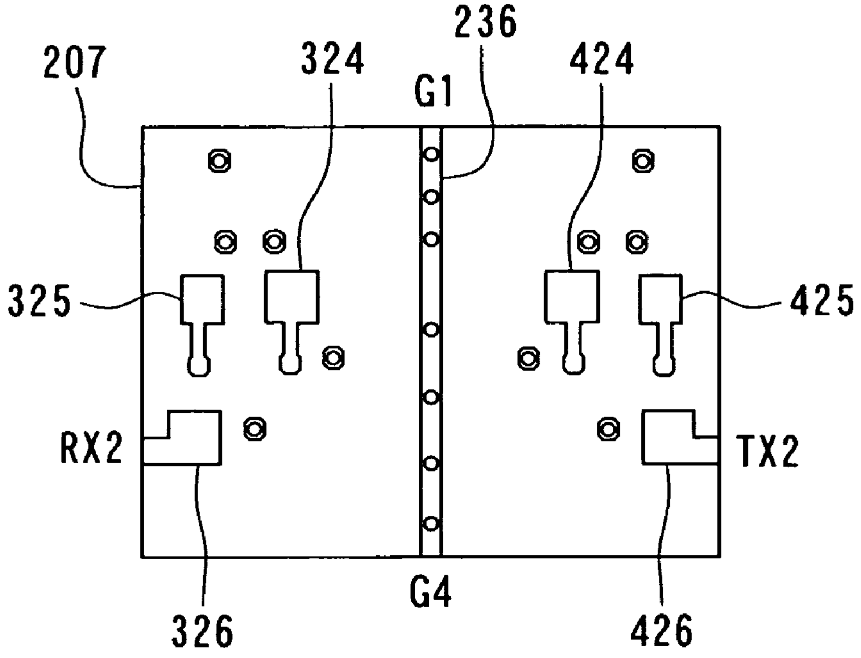
FIG. 11 is a top view illustrating a top surface of a seventh dielectric layer of the layered substrate of FIG. 3.

On the top surface of the seventh dielectric layer 207 of FIG. 11, a conductor layer 236 for the ground and conductor layers 324, 325, 326, 424, 425 and 426 for capacitors are formed. The conductor layer 236 is connected to the terminals G1 and G4. The conductor layer 235 of FIG. 8 is connected to the conductor layer 236 via through holes formed in the dielectric layers 204 to 206.

The conductor layer 303 of FIG. 5 is connected to the conductor layer 324 via through holes formed in the dielectric layers 201 to 206. The conductor layer 323 of FIG. 10 is connected to the conductor layer 325 via a through hole formed in the dielectric layer 206. The conductor layer 326 is connected to the terminal RX2. The conductor layers 324 and 325 make up portions of the capacitors 83 and 84 of FIG. 1, respectively. The conductor layer 326, together with the conductor layer 323 of FIG. 10, makes up the capacitor 43 of FIG. 1.

The conductor layer 403 of FIG. 5 is connected to the conductor layer 424 via through holes formed in the dielectric layers 201 to 206. The conductor layer 423 of FIG. 10 is connected to the conductor layer 425 via a through hole formed in the dielectric layer 206. The conductor layer 426 is connected to the terminal TX2. The conductor layers 424 and 425 make up portions of the capacitors 93 and 94 of FIG. 1, respectively. The conductor layer 426, together with the conductor layer 423 of FIG. 10, makes up the capacitor 73 of FIG. 1.

Figure 12:
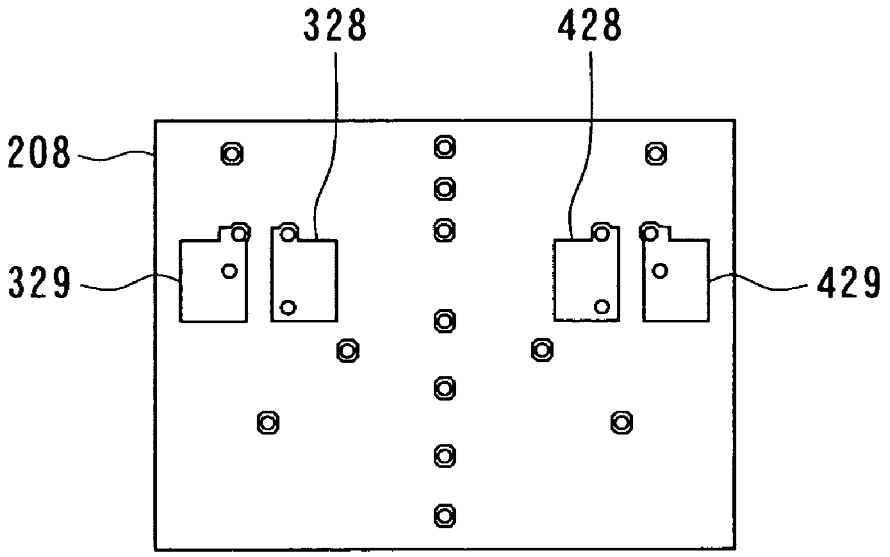
FIG. 12 is a top view illustrating a top surface of an eighth dielectric layer of the layered substrate of FIG. 3.

On the top surface of the eighth dielectric layer 208 of FIG. 12, conductor layers 328, 329, 428 and 429 for capacitors are formed.

The conductor layer 321 of FIG. 10 is connected to the conductor layer 328 via through holes formed in the dielectric layers 206 and 207. The conductor layer 322 of FIG. 10 is connected to the conductor layer 329 via through holes formed in the dielectric layers 206 and 207. The conductor layer 328, together with the conductor layer 324 of FIG. 11, makes up the capacitor 83 of FIG. 1. The conductor layer 329, together with the conductor layer 325 of FIG. 11, makes up the capacitor 84 of FIG. 1.

The conductor layer 421 of FIG. 10 is connected to the conductor layer 428 via through holes formed in the dielectric layers 206 and 207. The conductor layer 422 of FIG. 10 is connected to the conductor layer 429 via through holes formed in the dielectric layers 206 and 207. The conductor layer 428, together with the conductor layer 424 of FIG. 11, makes up the capacitor 93 of FIG. 1. The conductor layer 429, together with the conductor layer 425 of FIG. 11, makes up the capacitor 94 of FIG. 1.

Figure 13:
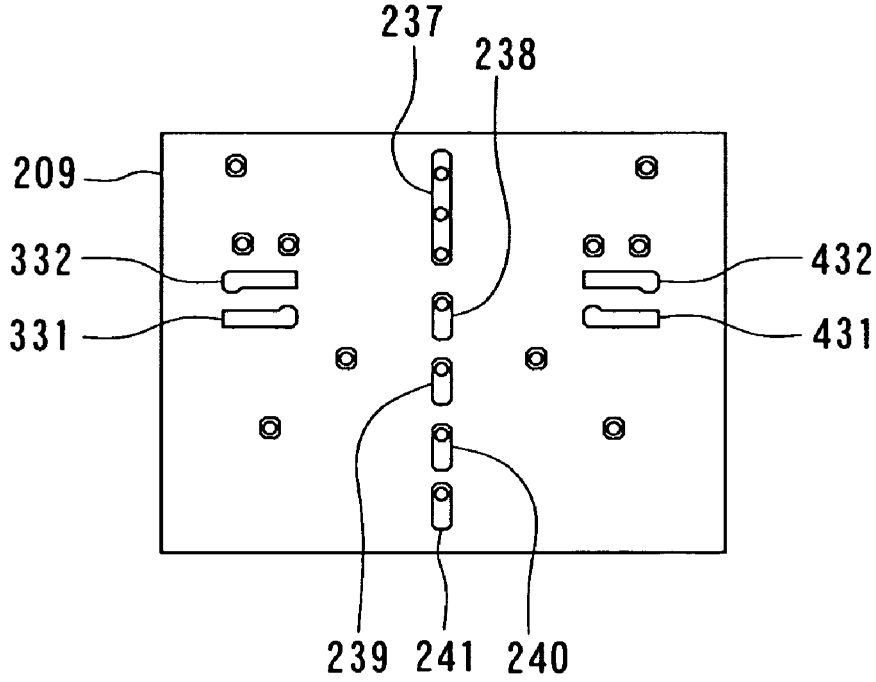
FIG. 13 is a top view illustrating a top surface of a ninth dielectric layer of the layered substrate of FIG. 3.

On the top surface of the ninth dielectric layer 209 of FIG. 13, conductor layers 237 to 241 for the ground and conductor layers 331, 332, 431 and 432 for capacitors are formed. The conductor layer 236 of FIG. 11 is connected to the conductor layers 237 to 241 via through holes formed in the dielectric layers 207 and 208.

The conductor layer 328 of FIG. 12 is connected to the conductor layer 331 via through holes formed in the dielectric layer 208. The conductor layer 329 of FIG. 12 is connected to the conductor layer 332 via through holes formed in the dielectric layer 208. The conductor layers 331 and 332 make up the capacitor 33 of FIG. 1.

The conductor layer 428 of FIG. 12 is connected to the conductor layer 431 via through holes formed in the dielectric layer 208. The conductor layer 429 of FIG. 12 is connected to the conductor layer 432 via through holes formed in the dielectric layer 208. The conductor layers 431 and 432 make up the capacitor 63 of FIG. 1.

Figure 14:
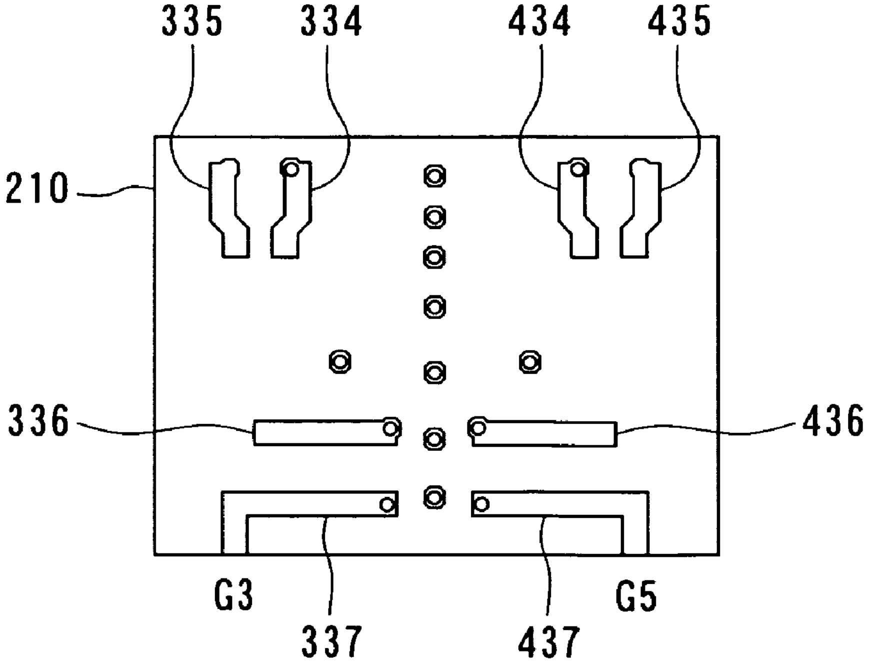
FIG. 14 is a top view illustrating a top surface of a tenth dielectric layer of the layered substrate of FIG. 3.

On the top surface of the tenth dielectric layer 210 of FIG. 14, conductor layers 334, 335, 336, 337, 434, 435, 436 and 437 are formed.

The conductor layer 328 of FIG. 12 is connected to the conductor layer 334 via through holes formed in the dielectric layers 208 and 209. The conductor layer 329 of FIG. 12 is connected to the conductor layer 335 via through holes formed in the dielectric layers 208 and 209. In addition, the conductor layer 234 of FIG. 7 is connected to the conductor layer 335 via through holes formed in the dielectric layers 203 to 209. The conductor layer 234 of FIG. 7 is connected to the conductor layer 336 via through holes formed in the dielectric layers 203 to 209. The conductor layer 337 is connected to the terminal G3. The conductor layers 334, 335, 336 and 337 make up the transmission lines 31, 34, 21 and 24 of FIG. 1, respectively. The transmission lines 31, 34, 21 and 24 formed by using the conductor layers 334, 335, 336 and 337 are distributed constant lines. In the embodiment, the longitudinal direction of the transmission lines 21 and 24 (the conductor layers 336 and 337) that the resonant circuit of the BPF 20 includes and the longitudinal direction of the transmission lines 31 and 34 (the conductor layers 334 and 335) that the resonant circuit of the BPF 30 includes intersect at a right angle.

The conductor layer 428 of FIG. 12 is connected to the conductor layer 434 via through holes formed in the dielectric layers 208 and 209. The conductor layer 429 of FIG. 12 is connected to the conductor layer 435 via through holes formed in the dielectric layers 208 and 209. In addition, the conductor layer 234 of FIG. 7 is connected to the conductor layer 435 via through holes formed in the dielectric layers 203 to 209. The conductor layer 234 of FIG. 7 is connected to the conductor layer 436 via through holes formed in the dielectric layers 203 to 209. The conductor layer 437 is connected to the terminal G5. The conductor layers 434, 435, 436 and 437 make up the transmission lines 61, 64, 51 and 54 of FIG. 1, respectively. The transmission lines 61, 64, 51 and 54 formed by using the conductor layers 434, 435, 436 and 437 are distributed constant lines. In the embodiment, the longitudinal direction of the transmission lines 51 and 54 (the conductor layers 436 and 437) that the resonant circuit of the BPF 50 includes and the longitudinal direction of the transmission lines 61 and 64 (the conductor layers 434 and 435) that the resonant circuit of the BPF 60 includes intersect at a right angle.

Figure 15:
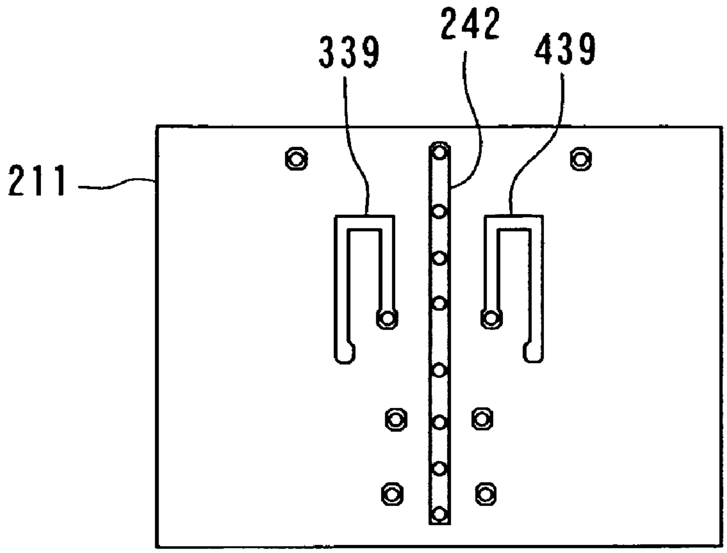
FIG. 15 is a top view illustrating a top surface of an eleventh dielectric layer of the layered substrate of FIG. 3.

On the top surface of the eleventh dielectric layer 211 of FIG. 15, a conductor layer 242 for the ground and conductor layers 339 and 439 for inductors are formed. The conductor layers 237 to 241 of FIG. 13 are connected to the conductor layer 242 via through holes formed in the dielectric layers 209 and 210.

The conductor layer 316 of FIG. 8 is connected to the conductor layer 339 via through holes formed in the dielectric layers 204 to 210. The conductor layer 339 makes up a portion of the inductor 81 of FIG. 1. The conductor layer 416 of FIG. 8 is connected to the conductor layer 439 via through holes formed in the dielectric layers 204 to 210. The conductor layer 439 makes up a portion of the inductor 91 of FIG. 1.

Figure 16:
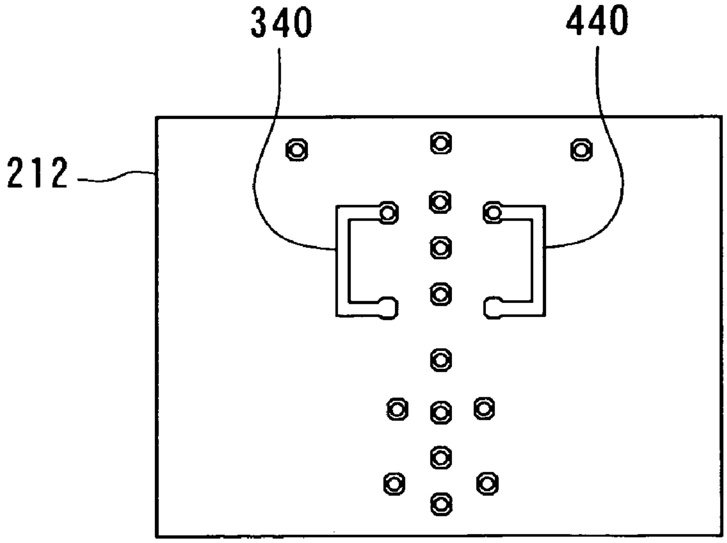
FIG. 16 is a top view illustrating a top surface of a twelfth dielectric layer of the layered substrate of FIG. 3.

On the top surface of the twelfth dielectric layer 212 of FIG. 16, conductor layers 340 and 440 for inductors are formed. The conductor layer 339 of FIG. 15 is connected to conductor layer 340 via a through hole formed in the dielectric layer 211. The conductor layer 340 makes up a portion of the inductor 81 of FIG. 1. The conductor layer 439 of FIG. 15 is connected to the conductor layer 440 via a through hole formed in the dielectric layer 211. The conductor layer 440 makes up a portion of the inductor 91 of FIG. 1.

Figure 17:
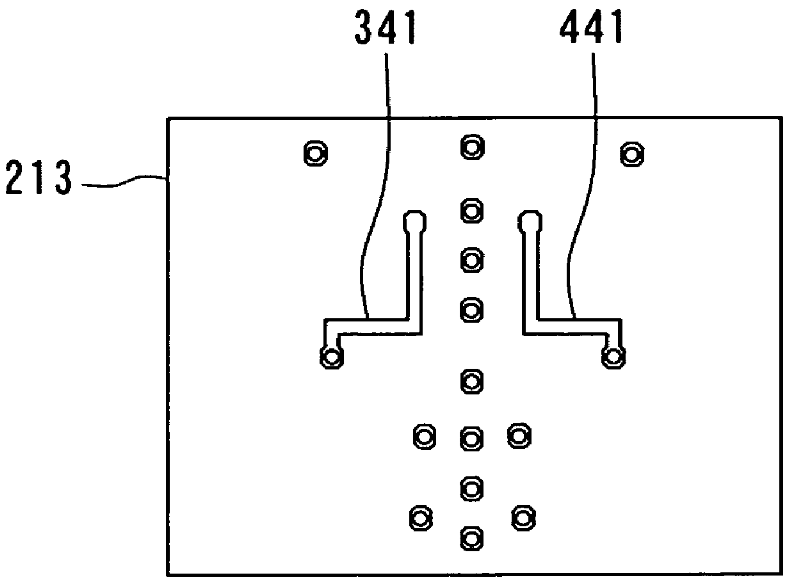
FIG. 17 is a top view illustrating a top surface of a thirteenth dielectric layer of the layered substrate of FIG. 3.

On the top surface of the thirteenth dielectric layer 213 of FIG. 17, conductor layers 341 and 441 for inductors are formed. The conductor layer 340 of FIG. 16 is connected to the conductor layer 341 via a through hole formed in the dielectric layer 212. The inductor 81 of FIG. 1 is made up of the conductor layers 339 to 341. The conductor layer 440 of FIG. 16 is connected to the conductor layer 441 via a through hole formed in the dielectric layer 212. The inductor 91 of FIG. 1 is made up of the conductor layers 439 to 441.

Figure 18:
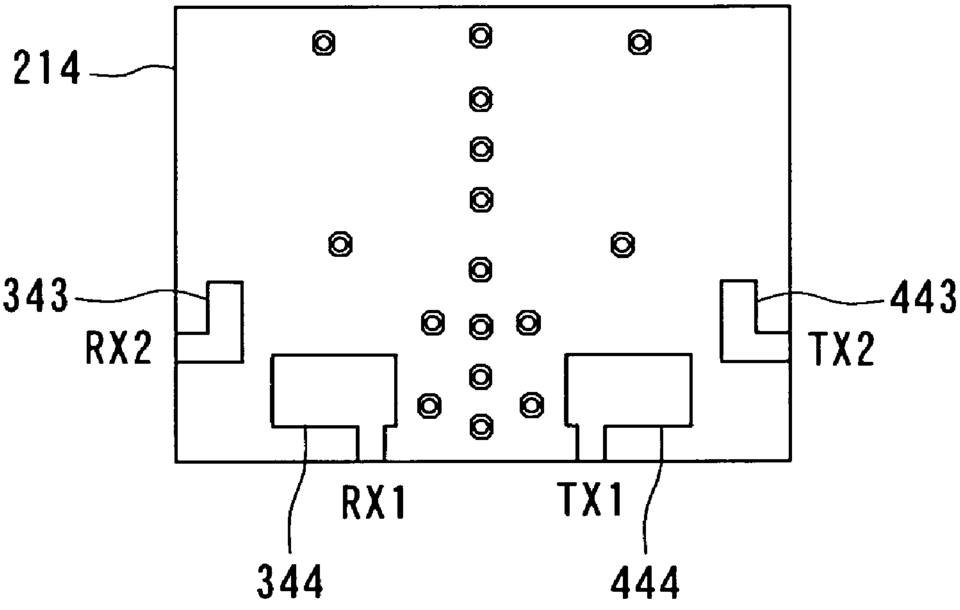
FIG. 18 is a top view illustrating a top surface of a fourteenth dielectric layer of the layered substrate of FIG. 3.

On the top surface of the fourteenth dielectric layer 214 of FIG. 18, conductor layers 343, 344, 443 and 444 for capacitors are formed. The conductor layer 343 is connected to the terminal RX2. The conductor layer 343 makes up a portion of the capacitor 44 of FIG. 1. The conductor layer 344 is connected to the terminal RX1. The conductor layer 344 makes up a portion of the capacitor 82 of FIG. 1. The conductor layer 443 is connected to the terminal TX2. The conductor layer 443 makes up a portion of the capacitor 74 of FIG. 1. The conductor layer 444 is connected to the terminal TX1. The conductor layer 444 makes up a portion of the capacitor 92 of FIG. 1.

Figure 19:
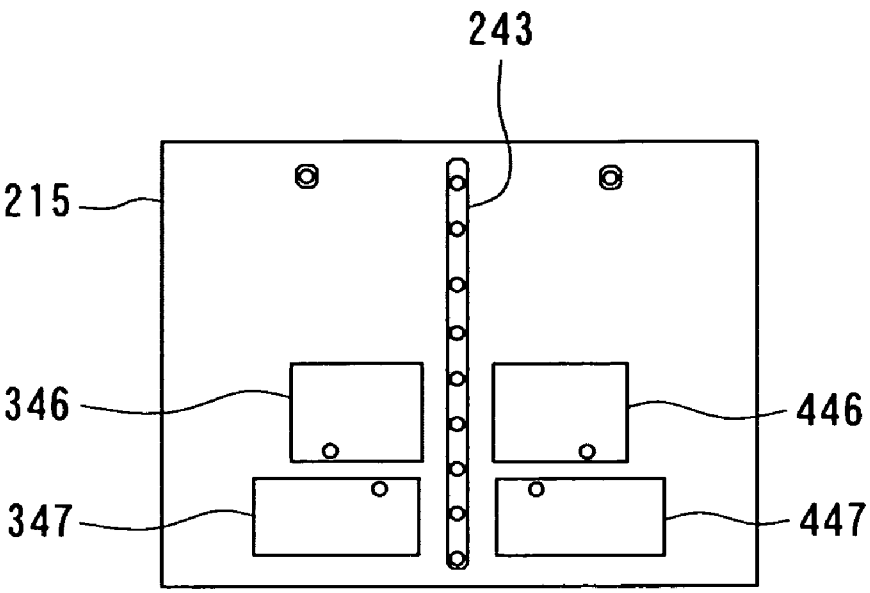
FIG. 19 is a top view illustrating a top surface of a fifteenth dielectric layer of the layered substrate of FIG. 3.

On the top surface of the fifteenth dielectric layer 215 of FIG. 19, a conductor layer 243 for the ground, conductor layers 346 and 446, and conductor layers 347 and 447 for capacitors are formed. The conductor layer 242 of FIG. 15 is connected to the conductor layer 243 via through holes formed in the dielectric layers 211 to 214.

The conductor layer 336 of FIG. 14 is connected to the conductor layer 346 via through holes formed in the dielectric layers 210 to 214. In addition, the conductor layer 341 of FIG. 17 is connected to the conductor layer 346 via through holes formed in the dielectric layers 213 and 214. The conductor layer 337 of FIG. 14 is connected to the conductor layer 347 via through holes formed in the dielectric layers 210 to 214. The conductor layer 347, together with the conductor layer 344 of FIG. 18, makes up the capacitor 82.

The conductor layer 436 of FIG. 14 is connected to the conductor layer 446 via through holes formed in the dielectric layers 210 to 214. In addition, the conductor layer 441 of FIG. 17 is connected to the conductor layer 446 via through holes formed in the dielectric layers 213 and 214. The conductor layer 437 of FIG. 14 is connected to the conductor layer 447 via through holes formed in the dielectric layers 210 to 214. The conductor layer 447, together with the conductor layer 444 of FIG. 18, makes up the capacitor 92.

Figure 20:
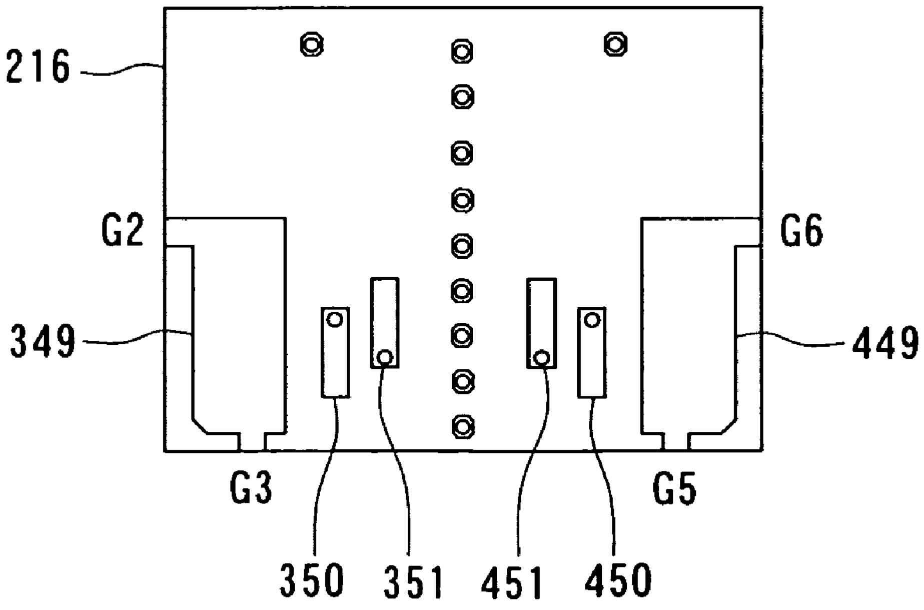
FIG. 20 is a top view illustrating a top surface of a sixteenth dielectric layer of the layered substrate of FIG. 3.

On the top surface of the sixteenth dielectric layer 216 of FIG. 20, conductor layers 349, 350, 351, 449, 450 and 451 for capacitors are formed.

The conductor layer 349 is connected to the terminals G2 and G3. The conductor layer 349, together with the conductor layer 343 of FIG. 18, makes up the capacitor 44 of FIG. 1. The conductor layer 346 of FIG. 19 is connected to the conductor layer 350 via a through hole formed in the dielectric layer 215. The conductor layer 347 of FIG. 19 is connected to the conductor layer 351 via a through hole formed in the dielectric layer 215. The conductor layers 350 and 351 make up the capacitor 23 of FIG. 1.

The conductor layer 449 is connected to the terminals G5 and G6. The conductor layer 449, together with the conductor layer 443 of FIG. 18, makes up the capacitor 74 of FIG. 1. The conductor layer 446 of FIG. 19 is connected to the conductor layer 450 via a through hole formed in the dielectric layer 215. The conductor layer 447 of FIG. 19 is connected to the conductor layer 451 via a through hole formed in the dielectric layer 215. The conductor layers 450 and 451 make up the capacitor 53 of FIG. 1.

Figure 21:
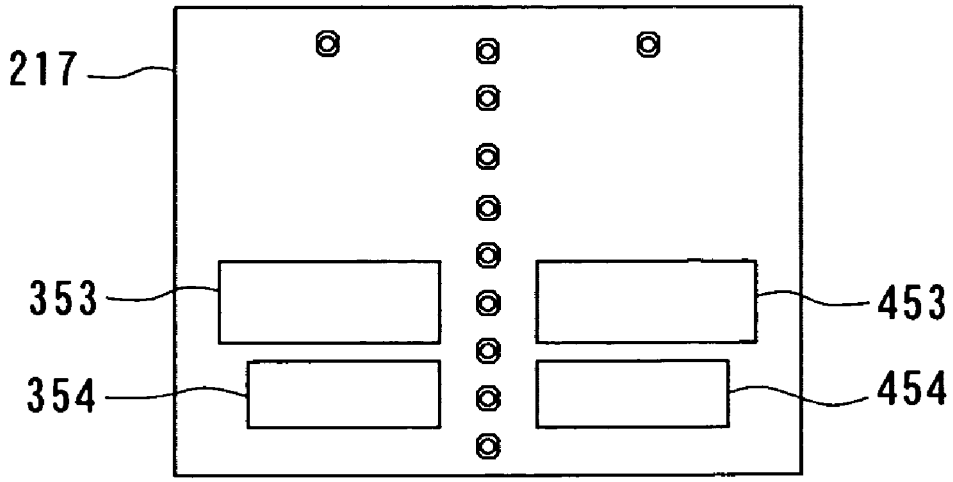
FIG. 21 is a top view illustrating a top surface of a seventeenth dielectric layer of the layered substrate of FIG. 3.

On the top surface of the seventeenth dielectric layer 217 of FIG. 21, conductor layers 353, 354, 453 and 454 for capacitors are formed.

The conductor layer 350 of FIG. 20 is connected to the conductor layer 353 via a through hole formed in the dielectric layer 216. The conductor layer 353 makes up a portion of the capacitor 22 of FIG. 1. The conductor layer 351 of FIG. 20 is connected to the conductor layer 354 via a through hole formed in the dielectric layer 216. The conductor layer 354 makes up a portion of the capacitor 25 of FIG. 1.

The conductor layer 450 of FIG. 20 is connected to the conductor layer 453 via a through hole formed in the dielectric layer 216. The conductor layer 453 makes up a portion of the capacitor 52 of FIG. 1. The conductor layer 451 of FIG. 20 is connected to the conductor layer 454 via a through hole formed in the dielectric layer 216. The conductor layer 454 makes up a portion of the capacitor 55 of FIG. 1.

Figure 22:
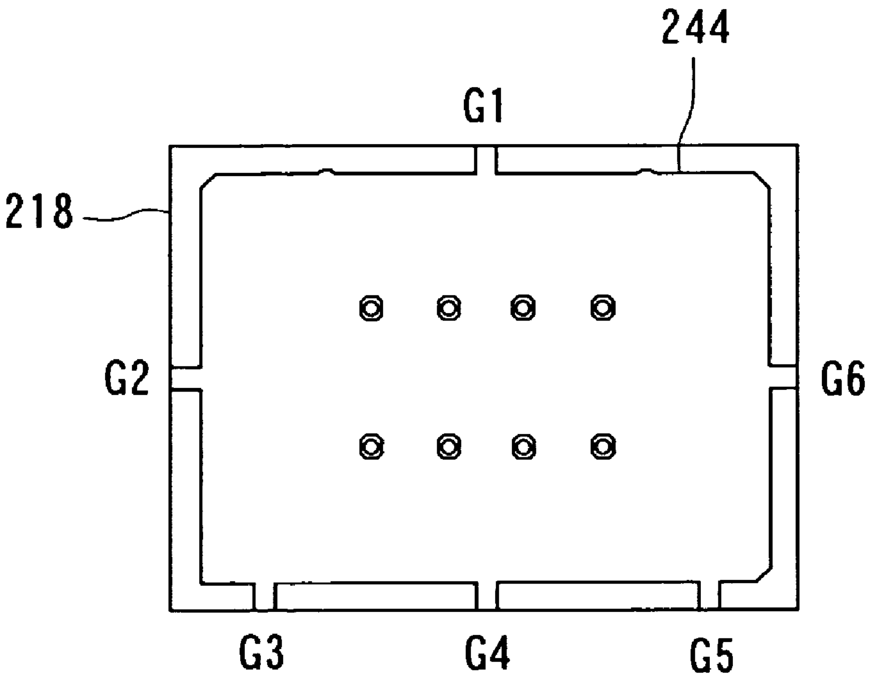
FIG. 22 is a top view illustrating a top surface of an eighteenth dielectric layer of the layered substrate of FIG. 3.

On the top surface of the eighteenth dielectric layer 218 of FIG. 22, a conductor layer 244 for the ground is formed. The conductor layer 244 is connected to the terminals G1 to G6. The conductor layer 244, together with the conductor layer 353 of FIG. 21, makes up the capacitor 22 of FIG. 1. In addition, the conductor layer 244, together with the conductor layer 354 of FIG. 21, makes up the capacitor 25 of FIG. 1.

The conductor layer 243 of FIG. 19 is connected to the conductor layer 244 via through holes formed in the dielectric layers 215 to 217. In addition, the conductor layers 334 and 434 of FIG. 14 are connected to the conductor layer 244 via through holes formed in the dielectric layers 210 to 217. Eight through holes connected to the conductor layer 244 are formed in the dielectric layer 218.

Figure 23:
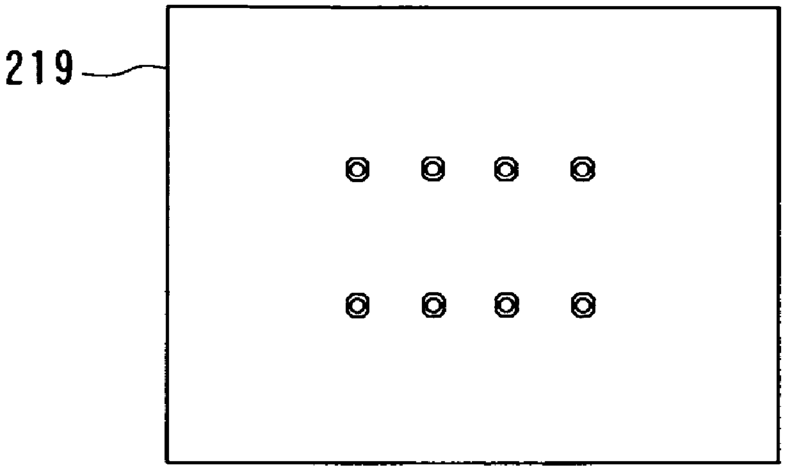
FIG. 23 is a top view illustrating a top surface of a nineteenth dielectric layer of the layered substrate of FIG. 3.
Figure 24:
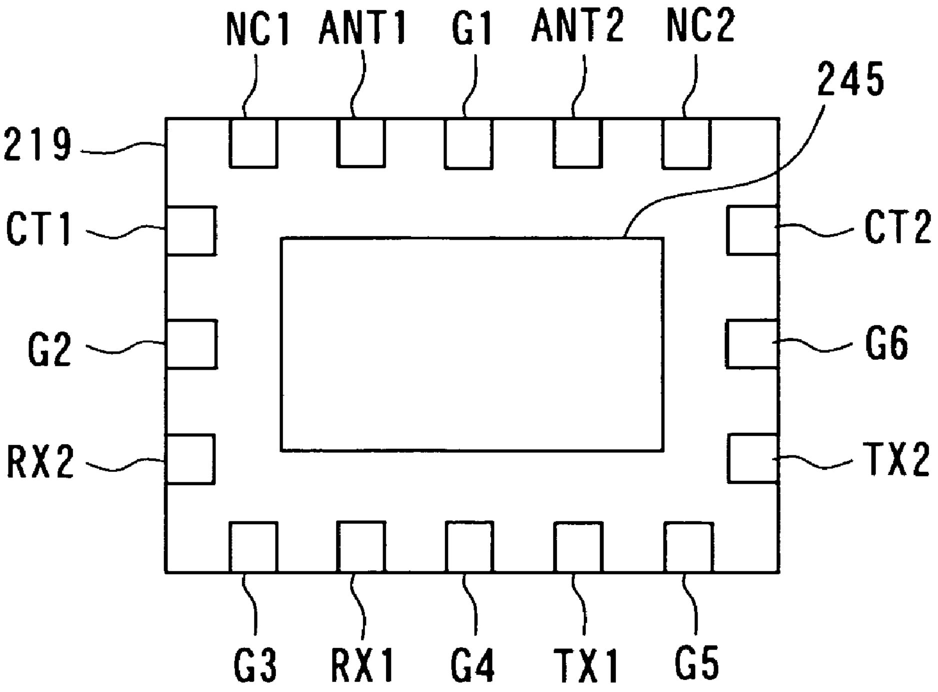
FIG. 24 is a top view illustrating the nineteenth dielectric layer of the layered substrate of FIG. 3 and a conductor layer therebelow.

The nineteenth dielectric layer 219 of FIG. 23 has eight through holes connected to the eight through holes formed in the dielectric layer 218.

As shown in FIG. 24, conductor layers making up the terminals ANT1, ANT2, RX1, RX2, TX1, TX2, CT1, CT2, G1 to G6, NC1 and NC2, and a conductor layer 245 for the ground are formed on the bottom surface of the dielectric layer 219. The conductor layer 244 of FIG. 22 is connected to the conductor layer 245 via the through holes formed in the dielectric layers 218 and 219.

Figure 25:
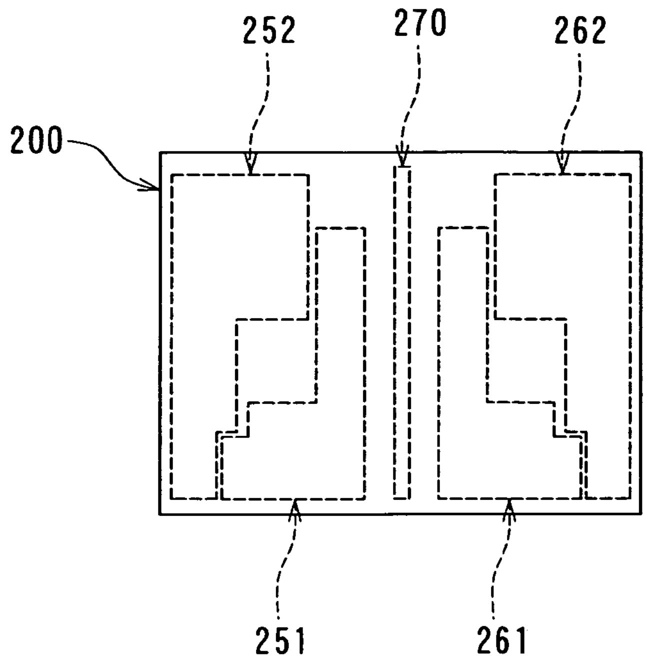
FIG. 25 is a view illustrating regions in which components forming paths of a first reception signal, a second reception signal, a first transmission signal and a second transmission signal are located inside the layered substrate of FIG. 3.

FIG. 25 illustrates regions inside the layered substrate 200 in which components making up paths of the first reception signal, the second reception signal, the first transmission signal and the second transmission signal are located. In FIG. 25, numeral 251 indicates the region in which the components making up the path of the first reception signal are located. Numeral 252 indicates the region in which the components making up the path of the second reception signal are located. Numeral 261 indicates the region in which the components making up the path of the first transmission signal are located. Numeral 262 indicates the region in which the components making up the path of the second transmission signal are located.

In the embodiment, as shown in FIG. 25, inside the layered substrate 200, the regions 251 and 252 in which the components making up the paths of the first and second reception signals are respectively located are separated from each other. In addition, the regions 261 and 262 in which the components making up the paths of the first and second transmission signals are respectively located are separated from each other.

Furthermore, the regions 251, 252 in which the components making up the paths of the first and second reception signals are respectively located are separated from the regions 261, 262 in which the components making up the paths of the first and second transmission signals are respectively located. Furthermore, a conductor portion 270 connected to the ground is provided between the regions 251, 252 and the regions 261, 262. The conductor portion 270 is made up of the conductor layers 235 to 243 for the ground and the through holes connected thereto.

Effects resulting from the locations of the capacitors 15, 16, 83 and 93 of the high frequency module 1 of the embodiment will now be described. In the embodiment, as previously described, the capacitors 15 and 83 for blocking passage of direct currents are located between the node N1 and the BPF 20 and between the node N1 and the BPF 30, respectively, while no capacitor for blocking passage of direct currents is provided between the port P11 and the node N1. Similarly, the capacitors 16 and 93 for blocking passage of direct currents are located between the node N2 and the BPF 50 and between the node N2 and the BPF 60, respectively, while no capacitor for blocking passage of direct currents is provided between the port P21 and the node N2. Owing to such a configuration, it is possible to predetermine the capacitance of each of the capacitors 15 and 16 so that the passing characteristic of the path of the first reception signal and the passing characteristic of the path of the first transmission signal are made favorable, and to predetermine the capacitance of each of the capacitors 83 and 93 so that the passing characteristic of the path of the second reception signal and the passing characteristic of the path of the second transmission signal are made favorable, according to the embodiment. As a result, it is possible to design the circuit so that the passing characteristics of the paths of the first reception signal, the second reception signal, the first transmission signal, and the second transmission signal are all favorable. This feature will now be described in detail with reference to FIG. 26 to FIG. 30.

Here, the passing characteristics of the respective signal paths are compared between the high frequency module 1 of the embodiment of the invention and a reference high frequency module. The reference high frequency module has such a configuration that the capacitors 15 and 16 are excluded and, instead, capacitors for blocking passage of direct currents are provided between the port P11 and the node N1 and between the port P21 and the node N2, respectively. The remainder of the configuration of the reference high frequency module is the same as that of the high frequency module 1 of the embodiment.

Figure 26:
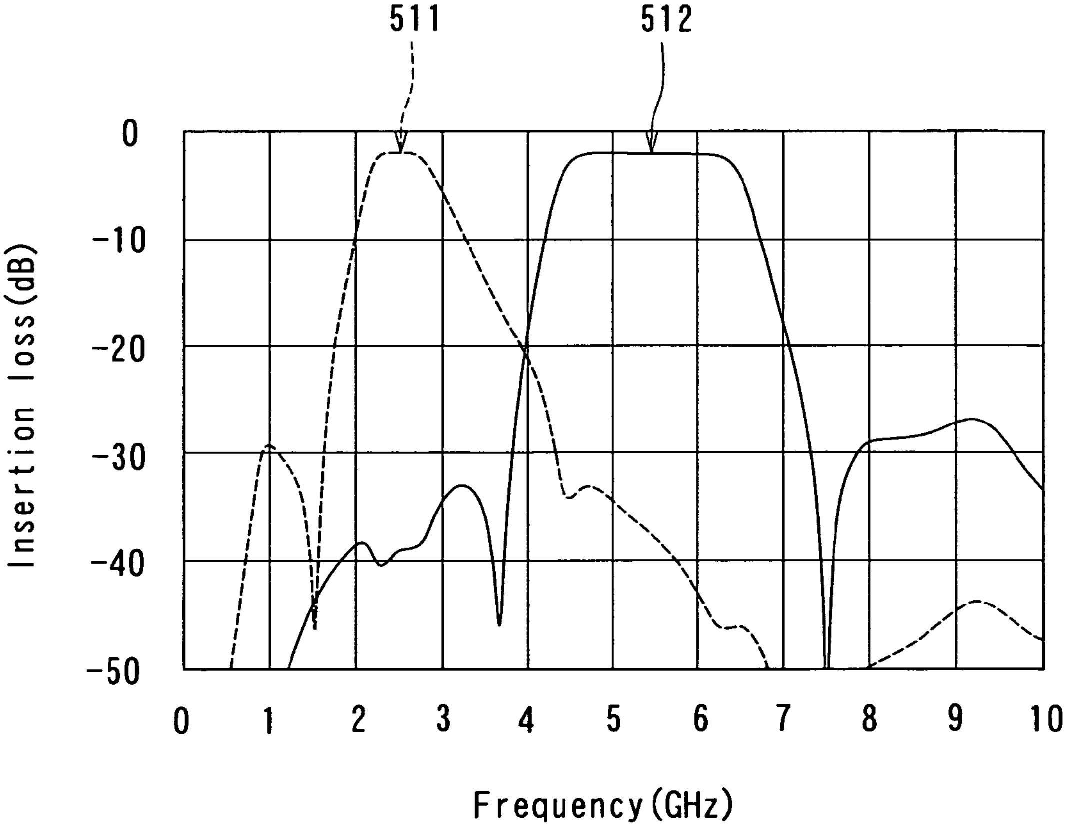
FIG. 26 is a plot showing a first example of passing characteristics of a reference high frequency module.

FIG. 26 shows a first example of passing characteristics of the paths of the first and second reception signals (frequency characteristics of insertion loss) of the reference high frequency module. In FIG. 26, numeral 511 indicates the passing characteristic of the path of the first reception signal. Numeral 512 indicates the passing characteristic of the path of the second reception signal. The path of the first reception signal specifically means the signal path between the first reception signal terminal RX1 and the antenna terminal ANT1 or ANT2. The path of the second reception signal specifically means the signal path between the second reception signal terminal RX2 and the antenna terminal ANT1 or ANT2.

The passing characteristic of the path of the first transmission signal is the same as the passing characteristic of the path of the first reception signal. The passing characteristic of the path of the second transmission signal is the same as the passing characteristic of the path of the second reception signal. The path of the first transmission signal specifically means the signal path between the first transmission signal terminal TX1 and the antenna terminal ANT1 or ANT2. The path of the second transmission signal specifically means the signal path between the second transmission signal terminal TX2 and the antenna terminal ANT1 or ANT2.

In the first example, the capacitance of each of the two capacitors for blocking passage of direct currents is predetermined so that priority is given to obtaining favorable passing characteristics of the path of the second reception signal and the path of the second transmission signal. In the first example, to be specific, this capacitance is predetermined to be 2.2 pF. The capacitance of each of the capacitors 83 and 93 is 1.1 pF in the first example.

Figure 27:
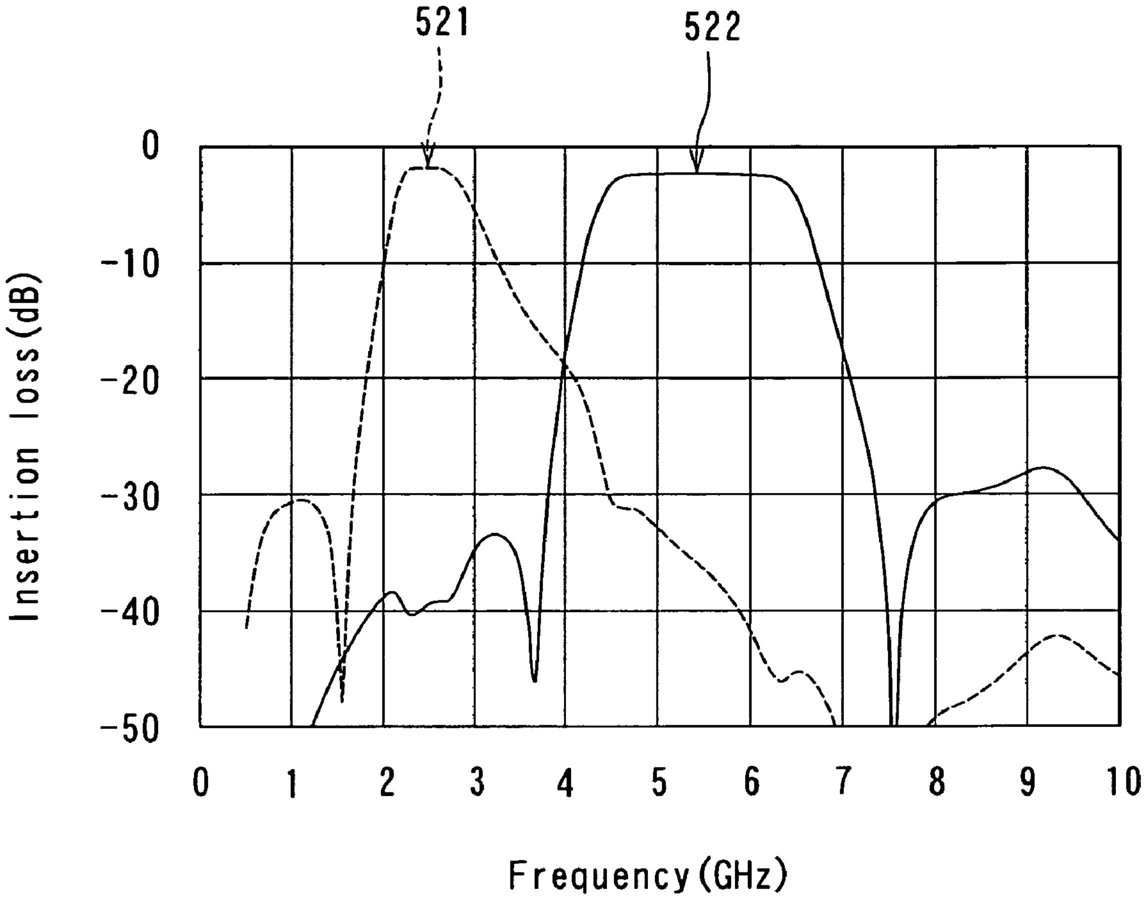
FIG. 27 is a plot showing a second example of passing characteristics of the reference high frequency module.

FIG. 27 shows a second example of passing characteristics of the paths of the first and second reception signals (frequency characteristics of insertion loss) of the reference high frequency module. In FIG. 27, numeral 521 indicates the passing characteristic of the path of the first reception signal. Numeral 522 indicates the passing characteristic of the path of the second reception signal. The passing characteristic of the path of the first transmission signal is the same as the passing characteristic of the path of the first reception signal. The passing characteristic of the path of the second transmission signal is the same as the passing characteristic of the path of the second reception signal. In the second example, the capacitance of each of the two capacitors for blocking passage of direct currents is predetermined so that priority is given to obtaining favorable passing characteristics of the path of the first reception signal and the path of the first transmission signal. In the second example, to be specific, this capacitance is predetermined to be 15 pF. The capacitance of each of the capacitors 83 and 93 is 1.1 pF in the second example.

Figure 28:
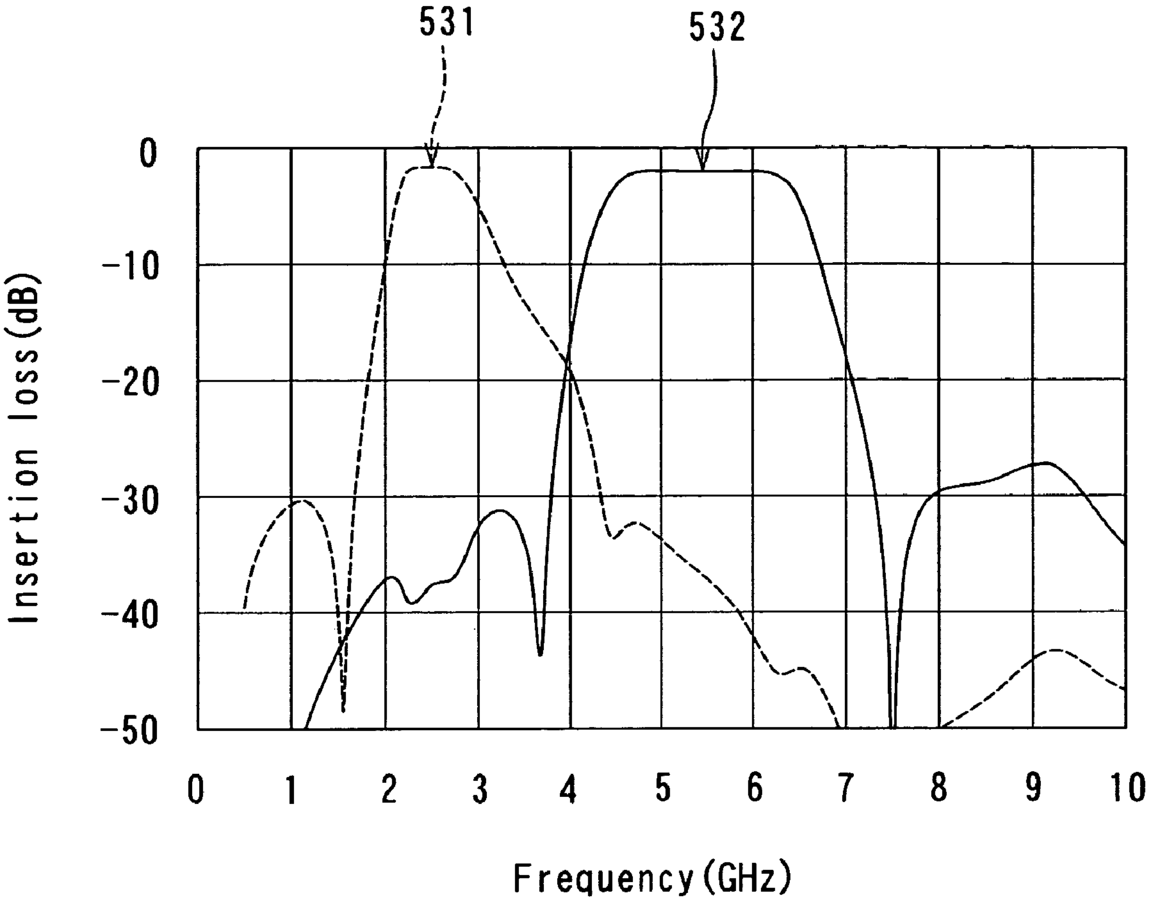
FIG. 28 is a plot showing a third example of passing characteristics of the reference high frequency module.

FIG. 28 shows a third example of passing characteristics of the paths of the first and second reception signals (frequency characteristics of insertion loss) of the reference high frequency module. In FIG. 28, numeral 531 indicates the passing characteristic of the path of the first reception signal. Numeral 532 indicates the passing characteristic of the path of the second reception signal. The passing characteristic of the path of the first transmission signal is the same as the passing characteristic of the path of the first reception signal. The passing characteristic of the path of the second transmission signal is the same as the passing characteristic of the path of the second reception signal. In the third example, the capacitance of each of the two capacitors for blocking passage of direct currents is predetermined so that the passing characteristics of the paths of the first reception signal and the first transmission signal and the passing characteristics of the paths of the second reception signal and the first transmission signal are balanced. In the third example, to be specific, this capacitance is predetermined to be 10 pF. The capacitance of each of the capacitors 83 and 93 is 1.1 pF in the third example.

Figure 29:
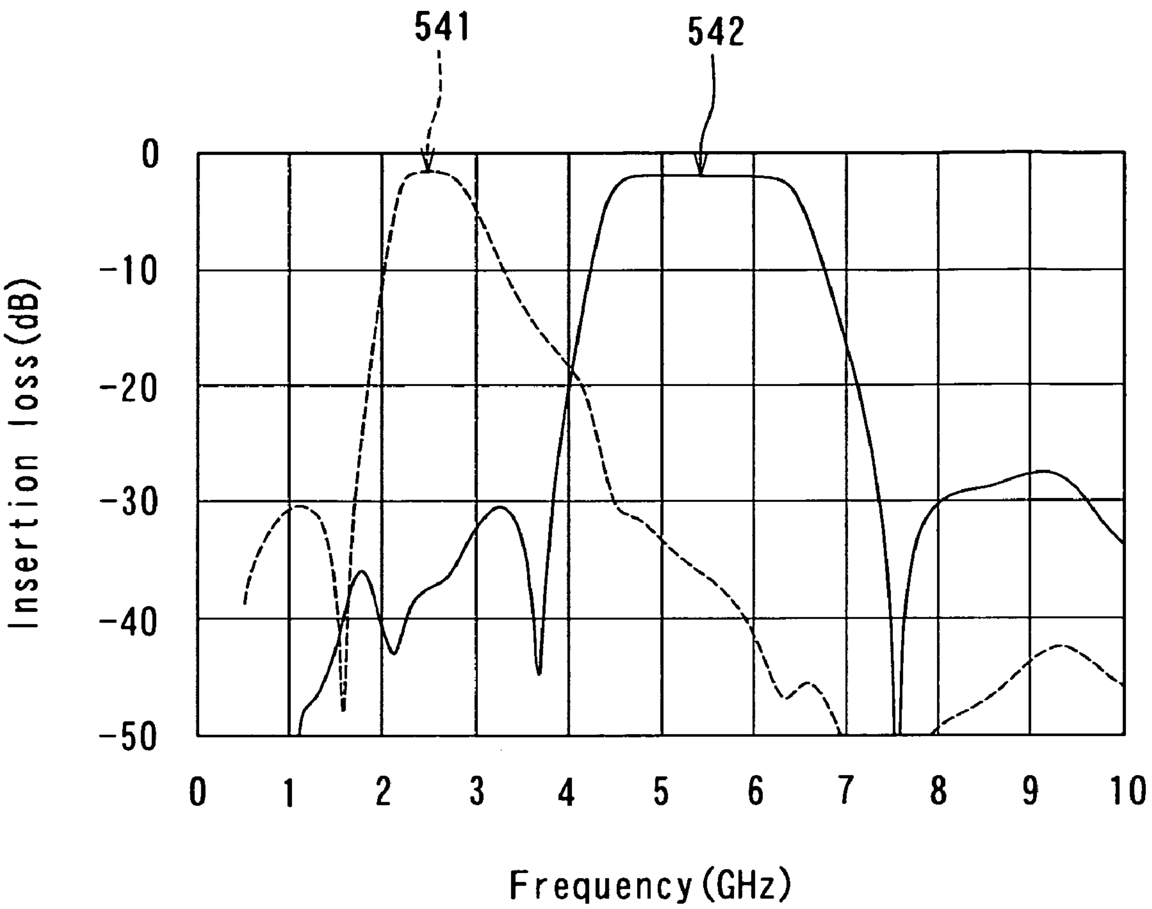
FIG. 29 is a plot showing an example of passing characteristics of the high frequency module of the embodiment of the invention.

FIG. 29 shows an example of passing characteristics of the paths of the first and second reception signals (frequency characteristics of insertion loss) of the high frequency module of the embodiment of the invention. In FIG. 29, numeral 541 indicates the passing characteristic of the path of the first reception signal. Numeral 542 indicates the passing characteristic of the path of the second reception signal. The passing characteristic of the path of the first transmission signal is the same as the passing characteristic of the path of the first reception signal. The passing characteristic of the path of the second transmission signal is the same as the passing characteristic of the path of the second reception signal. In this example, the capacitance of each of the capacitors 15 and 16 is predetermined so that favorable passing characteristics are obtained for the path of the first reception signal and the path of the first transmission signal. In the example, to be specific, the capacitance of each of the capacitors 15 and 16 is predetermined to be 15 pF. In addition, the capacitance of each of the capacitors 83 and 93 is predetermined so that favorable passing characteristics are obtained for the path of the second reception signal and the path of the second transmission signal. To be specific, the capacitance of each of the capacitors 83 and 93 is 1.1 pF in the example.

Figure 30:
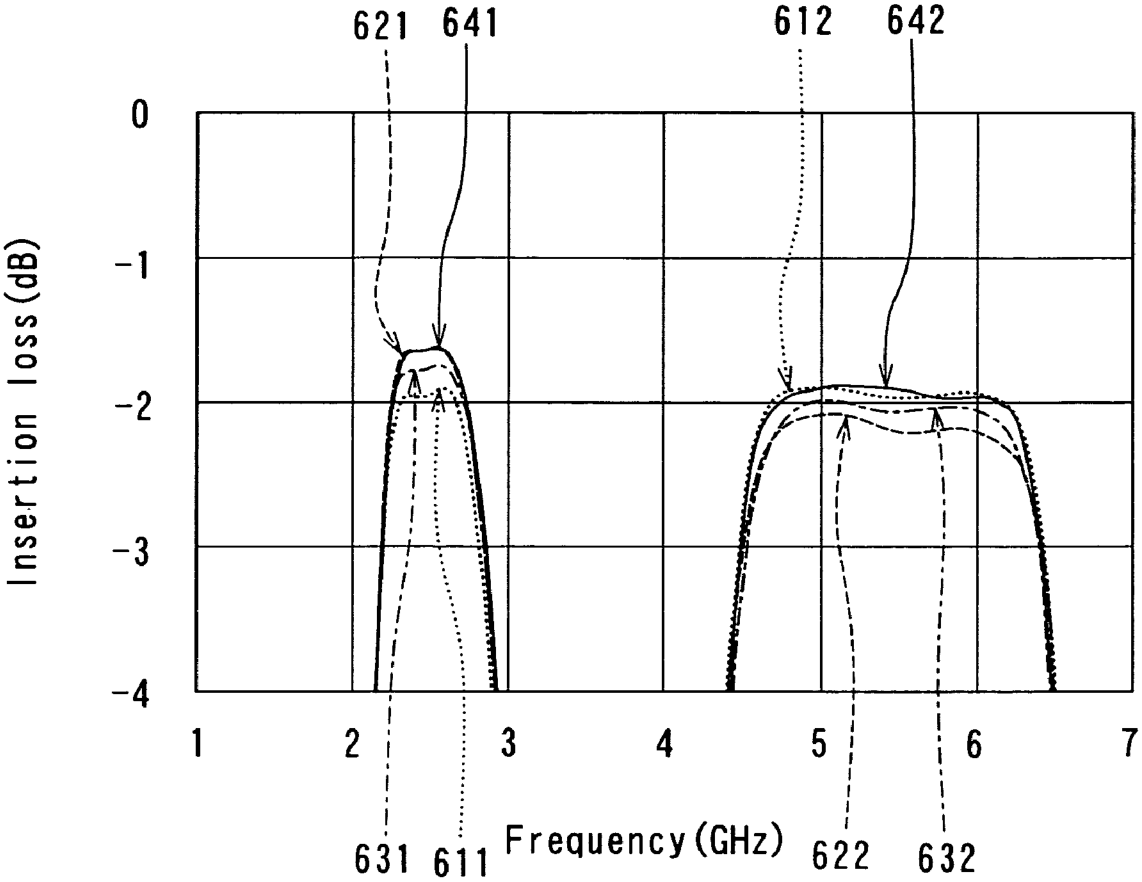
FIG. 30 is a plot showing portions of the characteristics of FIG. 26 to FIG. 29 that are enlarged.

FIG. 30 illustrates portions of the characteristics of FIG. 26 to FIG. 29 in the first and second frequency bands and bands around these bands that are enlarged. In FIG. 30, the dotted line with numeral 611 indicates the passing characteristic of the path of the first reception signal of the first example of the reference high frequency module. The dotted line with numeral 612 indicates the passing characteristic of the path of the second reception signal of the first example of the reference high frequency module. The broken line with numeral 621 indicates the passing characteristic of the path of the first reception signal of the second example of the reference high frequency module. The broken line with numeral 622 indicates the passing characteristic of the path of the second reception signal of the second example of the reference high frequency module. The alternate long and short dash line with numeral 631 indicates the passing characteristic of the path of the first reception signal of the third example of the reference high frequency module. The alternate long and short dash line with numeral 632 indicates the passing characteristic of the path of the second reception signal of the third example of the reference high frequency module. The solid line with numeral 641 indicates the passing characteristic of the path of the first reception signal of the example of the high frequency module of the embodiment of the invention. The solid line with numeral 642 indicates the passing characteristic of the path of the second reception signal of the example of the high frequency module of the embodiment of the invention.

FIG. 30 indicates the following. In the first example of passing characteristics of the reference high frequency module, the insertion loss of the path of each of the second reception signal and the second transmission signal in the second frequency band is small, but the insertion loss of the path of each of the first reception signal and the first transmission signal in the first frequency band is greater than those of the other examples. In the second example of passing characteristics of the reference high frequency module, the insertion loss of the path of each of the first reception signal and the first transmission signal in the first frequency band is small, but the insertion loss of the path of each of the second reception signal and the second transmission signal in the second frequency band is greater than those of the other examples. In the third example of passing characteristics of the reference high frequency module, the insertion loss of the path of each of the first reception signal and the first transmission signal in the first frequency band and the insertion loss of the path of each of the second reception signal and the second transmission signal in the second frequency band are both of values that are middle between the value of the first example and the value of the second example. In the example of passing characteristics of the high frequency module of the embodiment, the insertion loss of the path of each of the first reception signal and the first transmission signal in the first frequency band is as small as that of the second example of the reference high frequency module, and the insertion loss of the path of each of the second reception signal and the second transmission signal in the second frequency band is as small as that of the first example of the reference high frequency module. Because of these facts, according to the embodiment, it is noted that it is possible to design the circuit so as to obtain favorable passing characteristics of all of the paths of the first reception signal, the second reception signal, the first transmission signal and the second transmission signal.

Other effects of the high frequency module 1 of the embodiment will now be described. In the high frequency module 1, the diplexer 11 incorporates the BPFs 20 and 30 and the diplexer 12 incorporates the BPFs 50 and 60. The diplexers 11 and 12 may be formed by using high-pass filters and low-pass filters without using BPFs. In this case, however, a number of filters are required in the circuits connected to the high frequency module 1, and strict conditions are imposed on the filters provided in the circuits connected to the high frequency module 1. In the embodiment, in contrast, the diplexers 11 and 12 are formed by using the BPFs, so that the number of filters provided in the circuits connected to the high frequency module 1 is reduced, and the conditions required for the filters provided in the circuits connected to the high frequency module 1 are relieved.

The BPFs 20, 30, 50 and 60 are formed by using the resonant circuits. The BPFs may be formed by using a combination of a high-pass filter and a low-pass filter. In this case, however, the number of elements making up the BPFs increases, and it is difficult to adjust the characteristics of the BPFs. In the embodiment, in contrast, the BPFs are formed by using the resonant circuits, so that the number of elements making up the BPFs is reduced, and it is easy to adjust the characteristics of the BPFs.

The switch circuit 10 and the diplexers 11 and 12 are integrated through the use of the layered substrate 200. As a result, it is possible to reduce the mounting area of the high frequency module 1. For example, if two discrete diplexers 3.2 mm long and 1.6 mm wide and a single discrete switch 3.0 mm long and 3.0 mm wide are mounted on a substrate to form a high frequency module, the mounting area of the high frequency module including the land is approximately 23 $mm^2$. In the embodiment, in contrast, the mounting area of the high frequency module 1 including the land is approximately 16 $mm^2$. Therefore, according to the embodiment, it is possible to reduce the mounting area by approximately 30 percent as compared with the case in which the high frequency module is formed by mounting the two discrete diplexers and the single discrete switch on the substrate.

According to the embodiment, the number of steps required for mounting the components is smaller, compared with the case in which two discrete diplexers and a single discrete switch are mounted on a substrate to form a high frequency module. It is therefore possible to reduce costs required for mounting the components.

According to the embodiment, as thus described, it is possible to implement the high frequency module 1 that is used in a communications apparatus for a wireless LAN, capable of processing transmission and reception signals of a plurality of frequency bands, and capable of achieving a reduction in size.

The high frequency module 1 for the wireless LAN of the embodiment is mainly installed in an apparatus that requires a reduction in size or profile, such as a notebook personal computer. It is therefore preferred that the high frequency module 1 is 5 mm long or smaller, 4 mm wide or smaller, and 2 mm high or smaller.

The high frequency module 1 comprises the two antenna terminals ANT1 and ANT2, and the switch circuit 10 connects one of the diplexers 11 and 12 to one of the antenna terminals ANT1 and ANT2. As a result, according to the embodiment, it is possible to implement the high frequency module 1 provided for a diversity.

In the high frequency module 1, the substrate that integrates the components is the layered substrate 200 including the dielectric layers and the conductor layers alternately stacked. In addition, the resonant circuits used to form the BPFs 20, 30, 50 and 60 are formed by using some of the dielectric layers and some of the conductor layers. As a result, according to the embodiment, it is possible to further reduce the high frequency module 1 in dimensions.

In the embodiment, each of the resonant circuits includes the distributed constant line formed by using one of the conductor layers. As a result, the embodiment exhibits the following effects. For the high frequency circuit section for a wireless LAN, such a passing characteristic along the path of each signal is getting expected that great attenuation is obtained in a frequency region outside the pass band. To satisfy this requirement, the frequency characteristic of insertion loss of the BPFs 20, 30, 50 and 60 is such a characteristic that the insertion loss abruptly changes near the boundary between the pass band and the frequency region outside the pass band. To achieve such a characteristic with BPFs made up of lumped constant elements only, it is required to increase the degree of the filters. Consequently, the number of elements making up the BPFs is increased. It is therefore difficult to reduce the high frequency module in size and to achieve desired characteristics of the BPFs since the number of elements to adjust is great. In contrast, as in the embodiment, if the resonant circuits used to form the BPFs 20, 30, 50 and 60 include distributed constant lines, it is possible to reduce the number of elements and to make adjustment for achieving desired characteristics more easily, compared with the case in which the BPFs are made up of the lumped constant elements only. Therefore, according to the embodiment, it is possible to further reduce the high frequency module 1 in size and to achieve desired characteristics of the BPFs 20, 30, 50 and 60 more easily.

In the embodiment, each of the resonant circuits includes the transmission lines each of which is formed by using one of the conductor layers and has an inductance. The longitudinal direction of the transmission lines 21, 24 (the conductor layers 336, 337) that the resonant circuit of the BPF 20 includes and the longitudinal direction of the transmission lines 31, 34 (the conductor layers 334, 335) that the resonant circuit of the BPF 30 includes intersect at a right angle. It is thereby possible to prevent electromagnetic coupling between the transmission lines 21, 24 (the conductor layers 336, 337) and the transmission lines 31, 34 (the conductor layers 334, 335). As a result, it is possible to prevent electromagnetic interference between the BPF 20 and the BPF 30.

Similarly, the longitudinal direction of the transmission lines 51, 54 (the conductor layers 436, 437) that the resonant circuit of the BPF 50 includes and the longitudinal direction of the transmission lines 61, 64 (the conductor layers 434, 435) that the resonant circuit of the BPF 60 includes intersect at a right angle. It is thereby possible to prevent electromagnetic coupling between the transmission lines 51, 54 (the conductor layers 436, 437) and the transmission lines 61, 64 (the conductor layers 434, 435). As a result, it is possible to prevent electromagnetic interference between the BPF 50 and the BPF 60.

In the embodiment, as shown in FIG. 25, the layered substrate 200 includes the conductor portion 270 that is connected to the ground and disposed between all the resonant circuits that the diplexer 11 includes and all the resonant circuits that the diplexer 12 includes. As a result, according to the embodiment, it is possible to prevent electromagnetic interference between the diplexers 11 and 12.

In the embodiment, as shown in FIG. 25, inside the layered substrate 200, the regions 251 and 252 in which the components making up the paths of the first and second reception signals are respectively located are separated from each other. As a result, according to the embodiment, it is possible to prevent electromagnetic interference between the path of the first reception signal and the path of the second reception signal.

Similarly, inside the layered substrate 200, the regions 261 and 262 in which the components making up the paths of the first and second transmission signals are respectively located are separated from each other. As a result, according to the embodiment, it is possible to prevent electromagnetic interference between the path of the first transmission signal and the path of the second transmission signal.

In the embodiment, the switch circuit 10 is mounted on the layered substrate 200, and the conductor layers of the layered substrate 200 include the conductor layers 233 and 234 for the ground that are connected to the ground and disposed between the switch circuit 10 and all the resonant circuits (See FIG. 7). As a result, according to the embodiment, it is possible to prevent electromagnetic interference between the switch circuit 10 and the diplexers 11, 12.

In the embodiment, the diplexer 11 incorporates the LPF 40 that is connected in series to the BPF 30 and that allows reception signals in the second frequency band to pass. The diplexer 12 incorporates the LPF 70 that is connected in series to the BPF 60 and that allows transmission signals in the second frequency band to pass. If the number of stages of resonant circuits is increased in the BPFs 30 and 60, it is possible to increase the insertion loss outside the second frequency band. However, the insertion loss in the second frequency band also increases. According to the embodiment, in contrast, it is possible to increase the insertion loss at frequencies higher than the second frequency band while suppressing an increase in insertion loss in the second frequency band along the paths of the reception signal and the transmission signal in the second frequency band.

In the embodiment, the layered substrate 200 may be chosen out of a variety of types, such as one in which the dielectric layers are made of a resin, a ceramic, or a combination of these. However, it is preferred that the layered substrate 200 is a multilayer substrate of low-temperature co-fired ceramic that exhibits an excellent high frequency characteristic. It is preferred that, as described with reference to FIG. 5 to FIG. 24, the layered substrate 200 that is the multilayer substrate of low-temperature co-fired ceramic incorporates at least a plurality of inductance elements (inductors and transmission lines having inductances) and a plurality of capacitance elements (capacitors except the capacitors 15 and 16) for forming each of the diplexers 11 and 12. Furthermore, it is preferred that the switch circuit 10 is formed by using a field-effect transistor made of a GaAs compound semiconductor and is mounted on the layered substrate 200 that is the multilayer substrate of low-temperature co-fired ceramic, as shown in FIG. 2. In addition, it is preferred that, as shown in FIG. 2, a plurality of terminals are provided on the periphery of the layered substrate 200 that is the multilayer substrate of low-temperature co-fired ceramic, the terminals including: the antenna terminals ANT1 and ANT2 for connecting the switch circuit 10 to the antenna; the reception signal terminals RX1 and RX2 and the transmission signal terminals TX1 and TX2 for connecting the diplexers 11 and 12 to external circuits; the control terminals CT1 and CT2; and the ground terminals G1 to G6 connected to the ground.

The present invention is not limited to the foregoing embodiment but may be practiced in still other ways. For example, the diplexers 11 and 12 may be formed by using high-pass filters and low-pass filters instead of using BPFs.

In the embodiment, the diplexer 11 for separating the first and second reception signals from each other and the diplexer 12 for separating the first and second transmission signals from each other are provided. However, a diplexer for separating the first reception signal and the second transmission signal from each other and a diplexer for separating the first transmission signal and the second reception signal from each other may be provided in place of the diplexers 11 and 12.

Furthermore, a single antenna terminal may be provided in place of the two antenna terminals ANT1 and ANT2, and a switch circuit for selectively connecting one of the diplexers 11 and 12 to the single antenna terminal may be provided in place of the switch circuit 10.

Obviously many modifications and variations of the present invention are possible in the light of the above teachings. It is therefore to be understood that within the scope of the appended claims the invention may be practiced otherwise than as specifically described.

What is claimed is:

1. A high frequency module comprising:

at least one antenna terminal connected to an antenna;

a plurality of diplexers each of which separates signals in a first frequency band from signals in a second frequency band, which is higher than the first frequency band;

a switch circuit for connecting one of the diplexers to the at least one antenna terminal; and a substrate for integrating the at least one antenna terminal, the plurality of diplexers and the switch circuit, wherein:

the switch circuit is designed to receive a control signal for controlling switching of a state;

each of the diplexers incorporates: first to third ports; a first filter that is provided between the first and second ports, which allows signals in the first frequency band to pass; and a second filter that is provided between the first and third ports, which allows signals in the second frequency band to pass, the first port being connected to the switch circuit; and each of the diplexers further incorporates: a node between a signal path to the first filter and a signal path to the second filter as seen from the first port; a first capacitor provided between the node and the first filter and blocking passage of direct currents resulting from the control signal; and a second capacitor provided between the node and the second filter and blocking passage of direct currents resulting from the control signal.

2. The high frequency module according to claim 1, wherein:

in one of the diplexers, the first port receives reception signals in the first and second frequency bands inputted to the at least one antenna terminal and passing through the switch circuit, the first filter allows the reception signal in the first frequency band to pass, the second port outputs the reception signal in the first frequency band, the second filter allows the reception signal in the second frequency band to pass, and the third port outputs the reception signal in the second frequency band; and in another one of the diplexers, the second port receives a transmission signal in the first frequency band, the first filter allows the transmission signal in the first frequency band to pass, the third port receives a transmission signal in the second frequency band, the second filter allows the transmission signal in the second frequency band to pass, and the first port outputs the transmission signals in the first and second frequency bands.

3. The high frequency module according to claim 1, comprising a first antenna terminal and a second antenna terminal as the at least one antenna terminal, wherein the switch circuit connects one of the diplexers to one of the first and second antenna terminals.

4. The high frequency module according to claim 1, wherein the first capacitor has a capacitance greater than that of the second capacitor.

5. The high frequency module according to claim 4, wherein the capacitance of the first capacitor falls within a range of 10 to 100 pF inclusive.

6. The high frequency module according to claim 4, wherein: the substrate is a layered substrate including dielectric layers and conductor layers alternately stacked; the first capacitor is mounted on the layered substrate; and the second capacitor is formed by using at least one of the dielectric layers and at least one of the conductor layers.

7. The high frequency module according to claim 1, wherein the switch circuit is mounted on the substrate.

8. The high frequency module according to claim 1, wherein the switch circuit is formed by using a field-effect transistor made of a GaAs compound semiconductor.

9. The high frequency module according to claim 8, wherein:

the substrate is a multilayer substrate of low-temperature co-fired ceramic;

the substrate incorporates a plurality of inductance elements and a plurality of capacitance elements for forming each of the diplexers; and the switch circuit is mounted on the substrate, the high frequency module further comprising: a plurality of signal terminals for connecting the diplexers to external circuits; and a ground terminal connected to a ground, wherein the at least one antenna terminal, the signal terminals and the ground terminal are formed on a periphery of the substrate.

10. The high frequency module according to claim 1, wherein each of the filters is a band-pass filter.

11. The high frequency module according to claim 10, wherein the band-pass filters are formed by using resonant circuits.

12. The high frequency module according to claim 11, wherein: the substrate is a layered substrate including dielectric layers and conductor layers alternately stacked; and the resonant circuits are formed by using one or more of the dielectric layers and one or more of the conductor layers.

13. The high frequency module according to claim 12, wherein each of the resonant circuits includes a distributed constant line formed by using one of the conductor layers.

14. The high frequency module according to claim 12, wherein:

each of the resonant circuits includes a transmission line, which is formed by using one of the conductor layers and which has an inductance; and, in each of the diplexers, a longitudinal direction of the transmission line of the resonant circuit of the first filter and a longitudinal direction of the transmission line of the resonant circuit of the second filter intersect at a right angle.

15. The high frequency module according to claim 10, wherein each of the diplexers further incorporates a low-pass filter, which is connected in series to the second filter and which allows signals in the second frequency band to pass.

* * * * *